US012765352B2

(12) United States Patent
Chu et al.

(10) Patent No.: US 12,765,352 B2
(45) Date of Patent: Oct. 13, 2026

(54) SENSOR PACKAGE AND METHOD

(71) Applicant: Taiwan Semiconductor Manufacturing Co., Ltd., Hsinchu (TW)

(72) Inventors: Yung-Chi Chu, Kaohsiung City (TW); Sih-Hao Liao, New Taipei City (TW); Po-Han Wang, Hsinchu (TW); Yu-Hsiang Hu, Hsinchu (TW); Hung-Jui Kuo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 893 days.

(21) Appl. No.: 17/814,995

(22) Filed: Jul. 26, 2022

(65) Prior Publication Data

US 2022/0384333 A1 Dec. 1, 2022

Related U.S. Application Data

(62) Division of application No. 16/865,806, filed on May 4, 2020, now Pat. No. 11,942,417.

(51) Int. Cl.

| | |
|---|---|
| ***H01L 23/02*** | (2006.01) |
| ***H01L 23/12*** | (2006.01) |
| ***H10W 20/42*** | (2026.01) |
| *H10W 72/90* | (2026.01) |

(52) U.S. Cl.
CPC ........ *H10W 20/42* (2026.01); *H10W 72/9413* (2026.01)

(58) Field of Classification Search
CPC ......... H01L 21/568; H01L 2224/92244; H01L 24/19; H01L 21/6835; H01L 2221/68372; H10F 77/50
See application file for complete search history.

(56) References Cited

U.S. PATENT DOCUMENTS

| | | | |
|---|---|---|---|
| 8,361,842 | B2 | 1/2013 | Yu et al. |
| 8,680,647 | B2 | 3/2014 | Yu et al. |
| 8,703,542 | B2 | 4/2014 | Lin et al. |

(Continued)

FOREIGN PATENT DOCUMENTS

| | | |
|---|---|---|
| CN | 109786267 A | 5/2019 |
| CN | 110660753 A | 1/2020 |

(Continued)

*Primary Examiner* — Nicholas J Tobergte
*Assistant Examiner* — David J Goodwin
(74) *Attorney, Agent, or Firm* — Slater Matsil, LLP

(57) ABSTRACT

A device includes a sensor die having a sensing region at a top surface of the sensor die, an encapsulant at least laterally encapsulating the sensor die, a conductive via extending through the encapsulant, and a front-side redistribution structure on the encapsulant and on the top surface of the sensor die, wherein the front-side redistribution structure is connected to the conductive via and the sensor die, wherein an opening in the front-side redistribution structure exposes the sensing region of the sensor die, and wherein the front-side redistribution structure includes a first dielectric layer extending over the encapsulant and the top surface of the sensor die, a metallization pattern on the first dielectric layer, and a second dielectric layer extending over the metallization pattern and the first dielectric layer.

20 Claims, 28 Drawing Sheets

500

(56) References Cited

U.S. PATENT DOCUMENTS

| | | | | |
|---|---|---|---|---|
| 8,755,299 | B2 | 6/2014 | Doettling et al. | |
| 8,759,964 | B2 | 6/2014 | Pu et al. | |
| 8,778,738 | B1 | 7/2014 | Lin et al. | |
| 8,785,299 | B2 | 7/2014 | Mao et al. | |
| 8,803,306 | B1 | 8/2014 | Yu et al. | |
| 8,809,996 | B2 | 8/2014 | Chen et al. | |
| 8,829,676 | B2 | 9/2014 | Yu et al. | |
| 8,877,554 | B2 | 11/2014 | Tsai et al. | |
| 10,269,671 | B2 * | 4/2019 | Hsu | H01L 24/73 |
| 10,431,615 | B2 | 10/2019 | Jeong et al. | |
| 10,784,203 | B2 | 9/2020 | Huang et al. | |
| 10,832,985 | B2 * | 11/2020 | Chiang | H01L 24/19 |
| 11,049,805 | B2 | 6/2021 | Pan et al. | |
| 11,289,396 | B2 * | 3/2022 | Chu | H10F 39/811 |
| 11,315,891 | B2 | 4/2022 | Tsai et al. | |
| 11,854,927 | B2 * | 12/2023 | Tseng | H01L 21/6835 |
| 2007/0042521 | A1 * | 2/2007 | Yama | B81C 1/00333 438/48 |
| 2011/0291288 | A1 | 12/2011 | Wu et al. | |
| 2013/0062760 | A1 | 3/2013 | Hung et al. | |
| 2013/0062761 | A1 | 3/2013 | Lin et al. | |
| 2013/0069252 | A1 * | 3/2013 | Han | H01L 21/565 257/E23.116 |
| 2013/0168848 | A1 | 7/2013 | Lin et al. | |
| 2013/0221452 | A1 * | 8/2013 | Strothmann | H10F 39/011 438/48 |
| 2013/0264684 | A1 | 10/2013 | Yu et al. | |
| 2013/0307140 | A1 | 11/2013 | Huang et al. | |
| 2014/0022522 | A1 | 1/2014 | Sato | |
| 2014/0203429 | A1 | 7/2014 | Yu et al. | |
| 2014/0252646 | A1 | 9/2014 | Hung et al. | |
| 2014/0264930 | A1 | 9/2014 | Yu et al. | |
| 2017/0015548 | A1 * | 1/2017 | Mao | B81C 1/00333 |
| 2018/0294299 | A1 | 10/2018 | Baek et al. | |
| 2019/0148267 | A1 | 5/2019 | Chen et al. | |
| 2020/0105638 | A1 * | 4/2020 | Chiang | H01L 21/56 |
| 2022/0068818 | A1 | 3/2022 | Song et al. | |

FOREIGN PATENT DOCUMENTS

| | | | |
|---|---|---|---|
| CN | 110957229 | A | 4/2020 |
| DE | 102018130254 | A1 | 9/2019 |
| DE | 102019104259 | A1 | 4/2020 |
| KR | 20160011979 | A | 2/2016 |
| KR | 20180113885 | A | 10/2018 |
| KR | 20200036697 | A | 4/2020 |

* cited by examiner

SENSOR PACKAGE AND METHOD

PRIORITY CLAIM AND CROSS-REFERENCE

This application is a divisional of U.S. patent application Ser. No. 16/865,806, entitled "Sensor Package and Method," filed on May 4, 2020, which application is incorporated herein by reference

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is integrated fan-out (InFO) technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
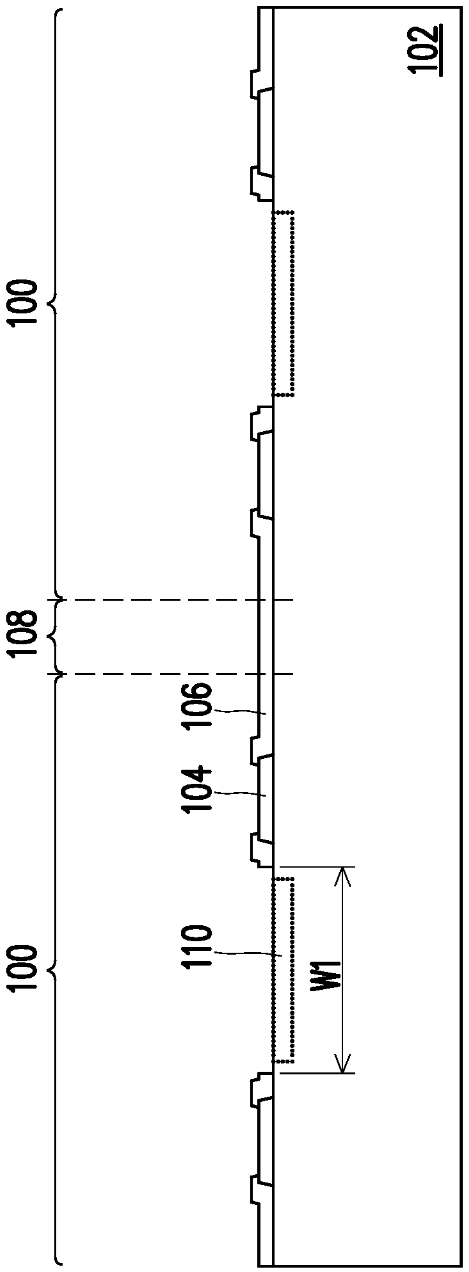
FIGS. 1 through 4 illustrate cross-sectional views of intermediate steps during a process for forming a sensor die with a sacrificial layer, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a sacrificial layer is formed over a sensor die prior to the sensor die being packaged as part of a sensor package. The sacrificial layer is removed using a dry etching process or a wet etching process during the packaging process. A redistribution structure may be formed to connect to the sensor die, forming the sensor package as an Integrated Fan-Out (InFO) package. The sensor package may include openings that expose the sensing regions of the sensor die. Packaging a sensor die in this manner may allow the form factor of the final sensor package to be smaller, may increase the mechanical reliability of the packaged sensor, and may increase the manufacturing yield as compared to other (e.g., wire bond) packaging schemes. The sensing regions of the sensor die may also be formed closer to the exterior of the sensor package, which can increase sensitivity and responsivity of the sensing operation.

FIGS. 1 through 4 illustrate cross-sectional views of intermediate steps during a process for forming a sensor die 100 with a sacrificial layer 112, in accordance with some embodiments. FIGS. 5 through 18 illustrate cross-sectional views of intermediate steps during a process for forming a sensor package 200 using a dry etching process, in accordance with some embodiments. FIG. 19 illustrates a sensor device 300 implementing the sensor package 200, in accordance with some embodiments. FIGS. 20 through 27 illustrate cross-sectional views of intermediate steps during a process for forming a sensor package 400 using a wet etching process, in accordance with some embodiments. FIG. 28 illustrates a sensor device 500 implementing the sensor package 400, in accordance with some embodiments.

FIGS. 1 through 4 illustrate the formation of a sensor die 100 with a sacrificial layer 112, in accordance with some embodiments. FIG. 1 illustrates multiple sensor dies 100 prior to singulation. As such, the individual sensor dies 100 shown in FIG. 1 are formed on a single substrate 102 and separated by scribe line regions 108.

The sensor dies 100 may be formed in the substrate 102 using applicable manufacturing processes. The substrate 102 may be, for example, a semiconductor substrate, such as silicon, which may be doped or undoped, and which may be a silicon wafer or an active layer of a semiconductor-on-insulator (SOI) substrate, or the like. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the active surface of the substrate 102 and may be interconnected by interconnect structures formed by, for example, metallization patterns in one or more dielectric layers on the substrate 102.

Each sensor die 100 may include one or more sensors, integrated circuits, logic circuits (e.g., central processing units, microcontrollers, etc.), memory (e.g., dynamic random access memory (DRAM), static random access memory (SRAM), etc.), power management circuits (e.g., power management integrated circuits (PMIC)), radio frequency (RF) components, micro-electro-mechanical-system (MEMS) components, signal processing circuits (e.g., digital signal processing (DSP) circuits), front-end circuits (e.g., analog front-end (AFE) circuits), the like, or a combination thereof.

In some embodiments, each sensor die 100 includes a sensor region 110 in which a sensor is formed. The sensor region 110 may include portions formed within the substrate 102 and/or over the substrate 102, and the sensor formed in the sensor region 110 may be physically and/or electrically connected to integrated circuits, metallization patterns, devices, or the like of the associated sensor die 100. The sensor region 110 may include an image sensor, an acoustic sensor, pressure sensor, temperature sensor, a MEMS sensor, or the like. The sensor region 110 may include one or more transducers and may also include one or more features that emit signals for measurement during operation. For example, the sensor region 110 may include a fingerprint sensor that operates by emitting ultrasonic acoustic waves and measuring reflected waves.

Each sensor die 100 further includes pads 104, such as aluminum pads, copper pads, or the like, to which external connections are made. The pads 104 are on the active surface of the sensor dies 100. One or more passivation films 106 are on the sensor dies and on portions of the pads 104. Openings extend through the passivation films 106 to expose the pads 104. In some embodiments, an opening in the passivation films 106 exposes the sensor region 110. The opening in the passivation films 106 may have a width $W_1$ that is between about 5 μm and about 100 μm, in some embodiments. In some embodiments, the sensor die 100 is packaged in an InFO package, and is packaged in a manner that allows the sensor region 110 to be exposed.

Figure 2:
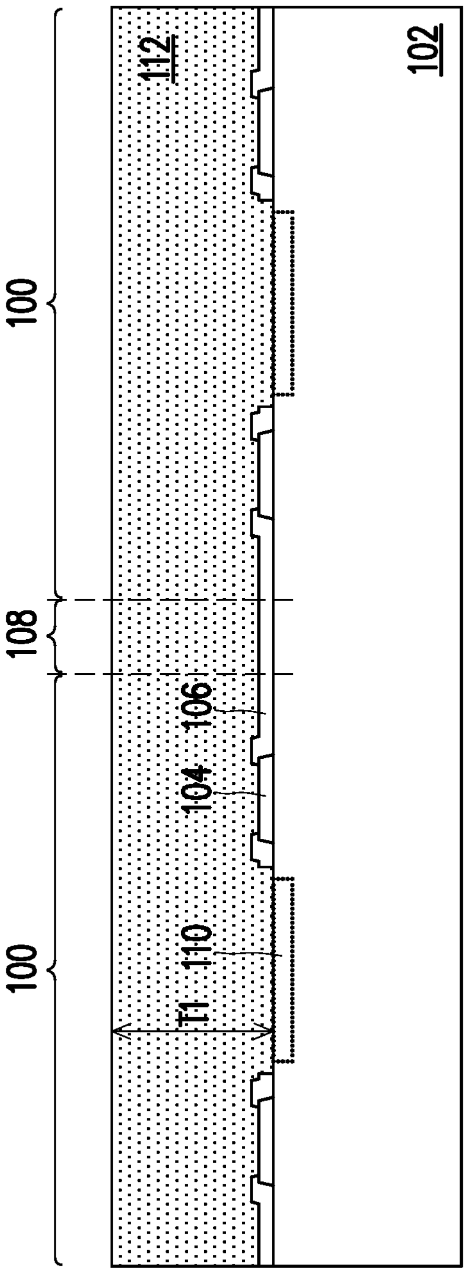

In FIG. 2, a sacrificial layer 112 is formed over the substrate 102 to cover the sensor dies 100, in accordance with some embodiments. In some embodiments, the sacrificial layer 112 may be cured after it is formed over the substrate 102. The sacrificial layer 112 may comprise, for example, a material that can be subsequently removed by an etching process, such as a wet etching process and/or a dry etching process. In some embodiments, the sacrificial layer 112 comprises a material that allows the sacrificial layer 112 to be cured and then subsequently removed using an etching process. In some embodiments, the sacrificial layer 112 comprises a material that allows the sacrificial layer 112 to be cured and then subsequently planarized using, for example, a Chemical-Mechanical Polish (CMP) process or a grinding process. The sacrificial layer 112 may comprise a polymer such as a polyimide, epoxy, polyolefin, or the like, or a composite material such as a polymer with one or more additives (e.g., stress release agents, plasticizers, etc.) that are incorporated to adjust one or more material properties of the polymer. The sacrificial layer 112 may be formed by any acceptable deposition process, such as spin coating, laminating, being dispensed as a liquid, the like, or a combination thereof. The sacrificial layer 112 may have a thickness $T_1$ above the substrate 102 that is between about 2 μm and about 50 μm, in some embodiments.

Figure 3:
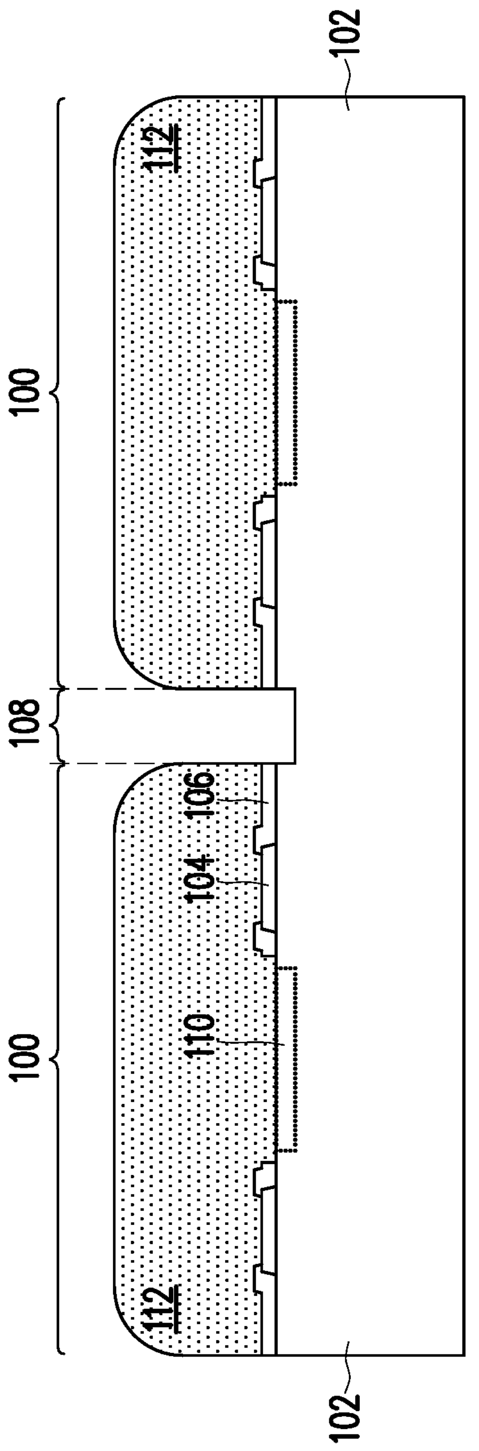
Figure 4:
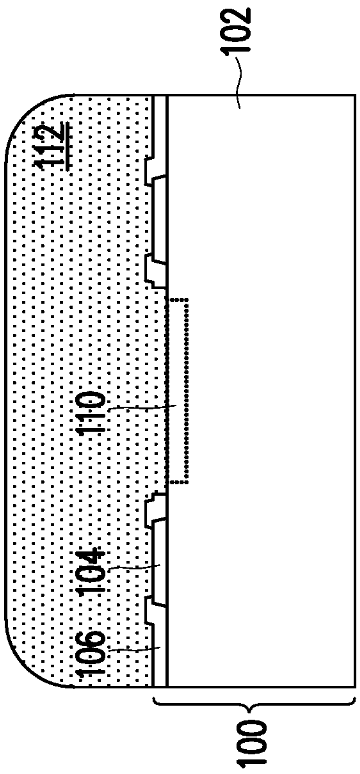

In FIGS. 3 and 4, a singulation process is performed to singulate individual sensor dies 100, in accordance with some embodiments. The singulation process is performed along scribe regions 108 and may include sawing, laser drilling, the like, or a combination thereof. In some embodiments, the singulation process includes forming a groove in the scribe regions 108 using a laser process, and then performing a sawing process to fully singulate the sensor dies 100. For example, FIG. 3 illustrates the substrate 102 after a laser process has been performed. As shown in FIG. 3, the laser process may be performed along scribe regions 108 to form grooves that extend through the sacrificial layer 112 and into the substrate 102. The laser process may include, for example, a UV laser or the like that is operated at a power between about 1 W and about 30 W, in some embodiments.

After the laser process is performed, a sawing process may be performed along the scribe regions 108 to fully singulate the sensor dies 100, as shown in FIG. 4. The use of a laser process to remove portions of the sacrificial layer 112 prior to the sawing process may reduce damage to the sacrificial layer 112 during the singulation process. In some embodiments, the sacrificial layer 112 over the sensor dies 100 may have a convex or rounded upper surface, as shown in FIG. 4. In this manner, individual sensor dies 100 are formed that are covered in the sacrificial layer 112.

Turning to FIGS. 5 through 26, intermediate steps in the formation of sensor package 200 (see FIG. 18), sensor device 300 (see FIG. 19), sensor package 400 (see FIG. 27), and sensor device 500 (see FIG. 28) are shown, in accordance with some embodiments. FIGS. 5 through 9 illustrate intermediate steps performed prior to the removal of the sacrificial layer 112, in accordance with some embodiments. FIGS. 10 through 19 illustrate intermediate steps in the removal of the sacrificial layer 112 using a dry etching process to form a sensor package 200 and a sensor device 300, in accordance with some embodiments. FIGS. 20 through 28 illustrate intermediate steps in the removal of the sacrificial layer 112 using a wet etching process to form a sensor package 400 and a sensor device 500, in accordance with some embodiments.

Figure 5:
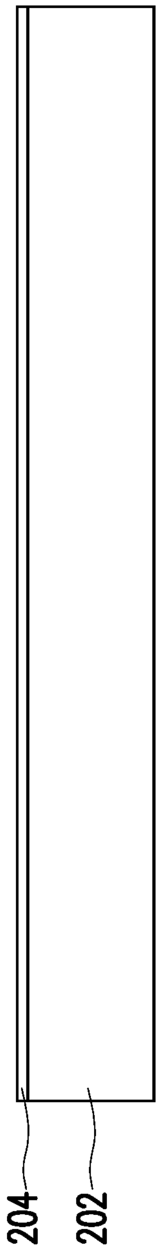
FIGS. 5 through 18 illustrate cross-sectional views of intermediate steps during a process for forming a sensor package using a dry etching process, in accordance with some embodiments.

In FIG. 5, a carrier substrate 202 is provided, and a release layer 204 is formed on the carrier substrate 202. The carrier substrate 202 may be, for example, a glass carrier substrate, a ceramic carrier substrate, or the like. The carrier substrate 202 may be a wafer, such that multiple packages can be formed on the carrier substrate 202 simultaneously. The release layer 204 may be formed of a polymer-based material, which may be removed along with the carrier substrate 202 from the overlying structures that will be formed in subsequent steps. In some embodiments, the release layer 204 is an epoxy-based thermal-release material, which loses its adhesive property when heated, such as a light-to-heat-conversion (LTHC) release coating. In other embodiments, the release layer 204 may be an ultra-violet (UV) glue, which loses its adhesive property when exposed to UV lights. The release layer 204 may be dispensed as a liquid and cured, may be a laminate film laminated onto the carrier substrate 202, or may be the like. The top surface of the release layer 204 may be leveled and may have a high degree of coplanarity.

Figure 6:
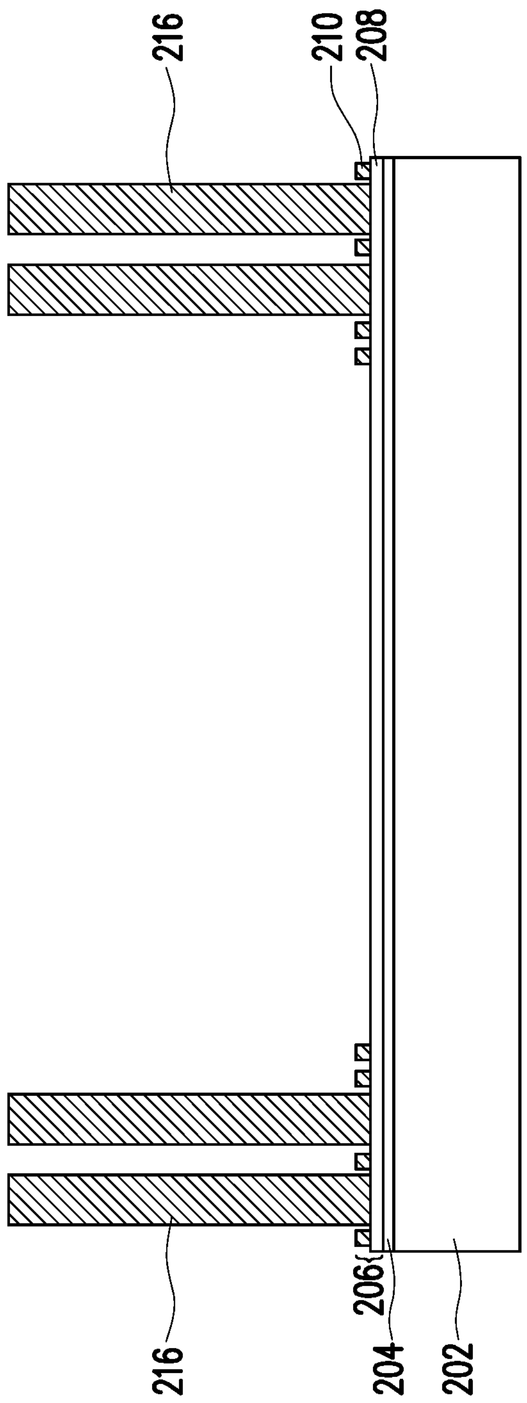

In FIG. 6, a back-side redistribution structure 206 and conductive vias 216 are formed on the release layer 204, in accordance with some embodiments. In the embodiment shown, the back-side redistribution structure 206 includes a dielectric layer 208 and a metallization pattern 210 (sometimes referred to as redistribution layers or redistribution lines). The back-side redistribution structure 206 is optional. In some embodiments, the metallization pattern 210 is omitted and only the dielectric layer 208 is formed.

The dielectric layer 208 is formed on the release layer 204. The bottom surface of the dielectric layer 208 may be in contact with the top surface of the release layer 204. In some embodiments, the dielectric layer 208 is formed of a polymer, such as polybenzoxazole (PBO), polyimide, benzocyclobutene (BCB), or the like. In other embodiments, the dielectric layer 208 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 208 may be formed by any acceptable deposition process, such as spin coating, chemical vapor deposition (CVD), laminating, the like, or a combination thereof.

The metallization pattern 210 is formed on the dielectric layer 208. As an example process to form metallization pattern 210, a seed layer is formed over the dielectric layer 208. In some embodiments, the seed layer is a metal layer, which may be a single layer or a composite layer including a plurality of sub-layers formed of different materials. In some embodiments, the seed layer is a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 210. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may be a metal, like copper, titanium, tungsten, aluminum, the like, or combinations thereof. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 210.

It should be appreciated that the back-side redistribution structure 206 may include any number of dielectric layers and metallization patterns. Additional dielectric layers and metallization patterns may be formed by repeating the processes for forming the dielectric layer 208 and metallization pattern 210. The metallization patterns may include conductive lines and conductive vias. The conductive vias may be formed during the formation of the metallization pattern by forming the seed layer and conductive material of the metallization pattern in the opening of the underlying dielectric layer. The conductive vias may therefore interconnect and electrically connect the various conductive lines. In some embodiments, the back-side redistribution structure 206 includes a topmost dielectric or passivation layer that covers and protects the metallization pattern 210. In the embodiment shown, the topmost layer is omitted, and the subsequently formed encapsulant 242 is used to protect the metallization pattern 210.

Still referring to FIG. 6, conductive vias 216 are formed on and extending away from the dielectric layer 208. As an example process to form the conductive vias 216, a seed layer is formed over the back-side redistribution structure 206, e.g., on the dielectric layer 208 and the metallization pattern 210. The seed layer for the conductive vias 216 may be different than the seed layer for the metallization pattern 210, and may be further formed over the metallization pattern 210. In some embodiments, the seed layer is a metal layer, which may be a single layer or a composite layer including a plurality of sub-layers formed of different materials. In a particular embodiment, the seed layer is a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may be a metal, like copper, titanium, tungsten, aluminum, the like, or combinations thereof. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive vias 216. In the embodiment shown, the conductive vias 216 are formed directly on the dielectric layer 208 and are connected to the metallization pattern 210 by conductive lines. In other embodiments, the conductive vias 216 are plated from features of the metallization pattern 210. The conductive vias 216 may be formed to have a height above the back-side redistribution structure 206 that is greater than the height of an attached sensor die 100, described below.

Figure 7:
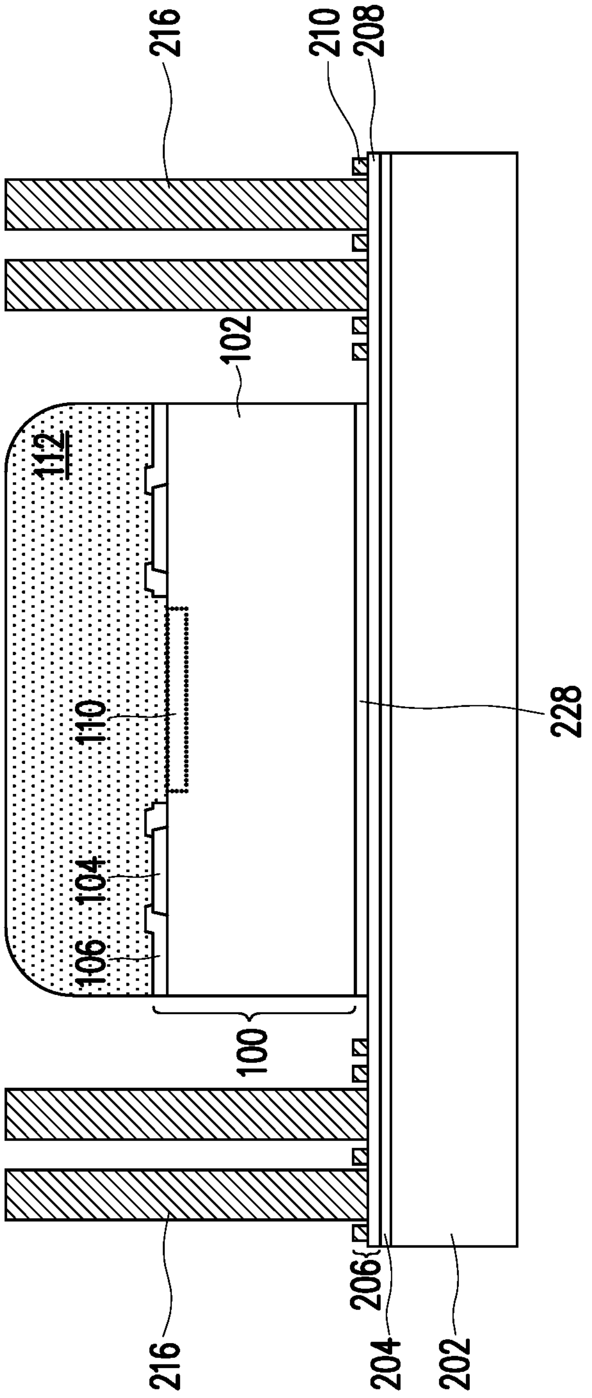

In FIG. 7, a sensor die 100 is adhered to the back-side redistribution structure 206 by an adhesive 228. The adhesive 128 is formed on the back surface of the sensor die 100 and adheres the sensor die 100 to the dielectric layer 208 of the back-side redistribution structure 206. The adhesive 228 may be any suitable adhesive, epoxy, die attach film (DAF), or the like. The adhesive 228 may be applied to a back-side of the sensor die 100 or may be applied over the dielectric layer 208. For example, the adhesive 228 may be applied to the back-side of the sensor die 100 before singulating to separate the sensor die 100.

Although one sensor die 100 is illustrated as being adhered to the back-side redistribution structure 206, it should be appreciated that more than one sensor dies 100 may be adhered and present in the final sensor package 200. In such embodiments, the sensor dies 100 may vary in size and type. In some embodiments, the sensor die 100 may be dies with a large footprint, such as system-on-chip (SoC) devices. In embodiments where the sensor dies 100 have a large footprint, the space available for the conductive vias 216 may be limited. Use of the back-side redistribution structure 206 allows for an improved interconnect arrangement when the sensor package 200 has limited space available for the conductive vias 216. In embodiments where a single sensor die 100 is used, logic dies, memory dies, or a combination thereof may also be included with the sensor die 100.

Figure 8:
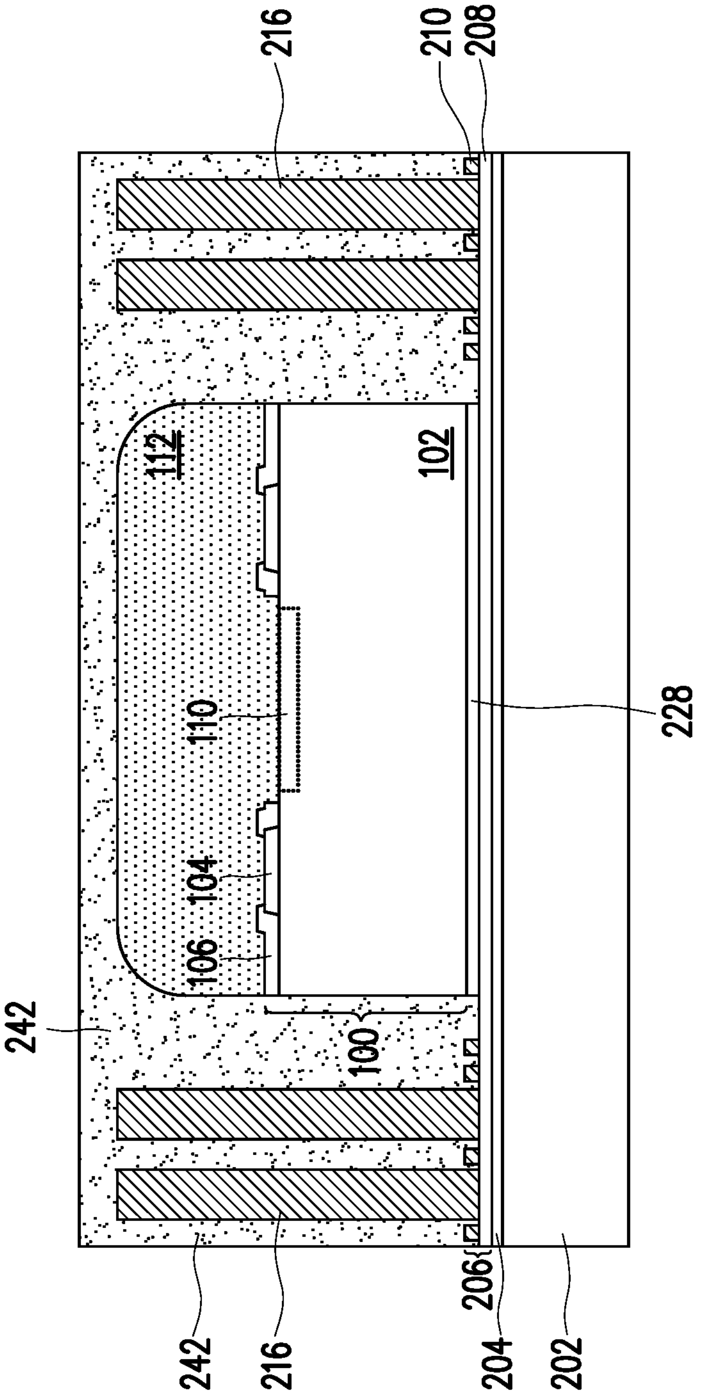
Figure 9:
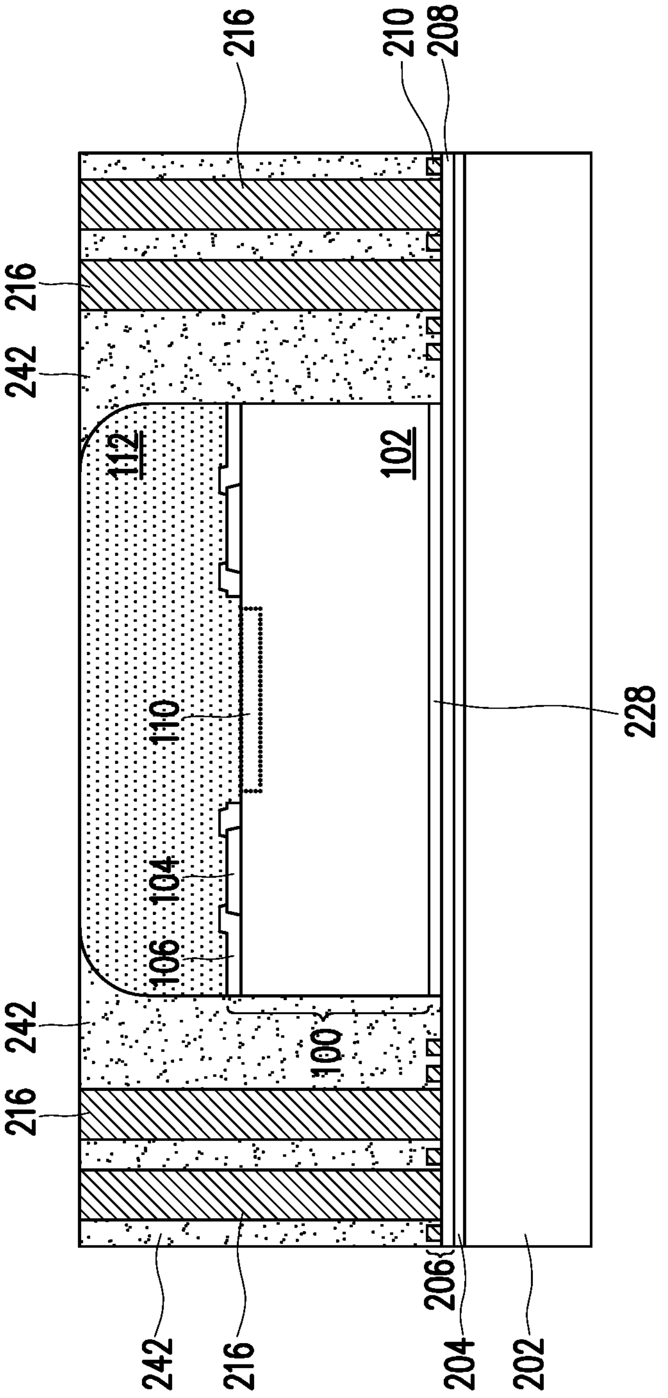

In FIG. 8, an encapsulant 242 is formed on the various components, in accordance with some embodiments. After formation, the encapsulant 242 at least laterally encapsulates the conductive vias 216 and the sensor die 100. The metallization pattern 210 is thus disposed between the encapsulant 242 and the dielectric layer 208. The encapsulant 242 may be a molding compound, epoxy, resin, or the like. In some embodiments, the encapsulant 242 includes a filler material, such as particles of silicon oxide or the like. The encapsulant 242 may be applied by compression molding, transfer molding, or the like. The encapsulant 242 may then be cured. In FIG. 9, a planarization process is performed, in accordance with some embodiments. The planarization process may include a CMP process, a grinding process, or the like. The planarization process may expose the conductive vias 216 and the sacrificial layer 112. In some cases, surfaces of the conductive vias 216, the sacrificial layer 112, and the encapsulant 242 are level after the planarization process.

FIGS. 10 through 19 illustrate the formation of a sensor package 200 and a sensor device 300, in accordance with some embodiments. The sensor package 200 (see FIG. 18) is a package incorporating the sensor die 100, and the sensor device 300 (see FIG. 19) is a device incorporating the sensor package 200, in accordance with some embodiments. FIGS. 10 through 19 describe a process flow in which a dry etching process is used to remove the sacrificial layer 112. Accordingly, the material of the sacrificial layer 112 may be a material chosen to be removable by a dry etching process.

Figure 10:
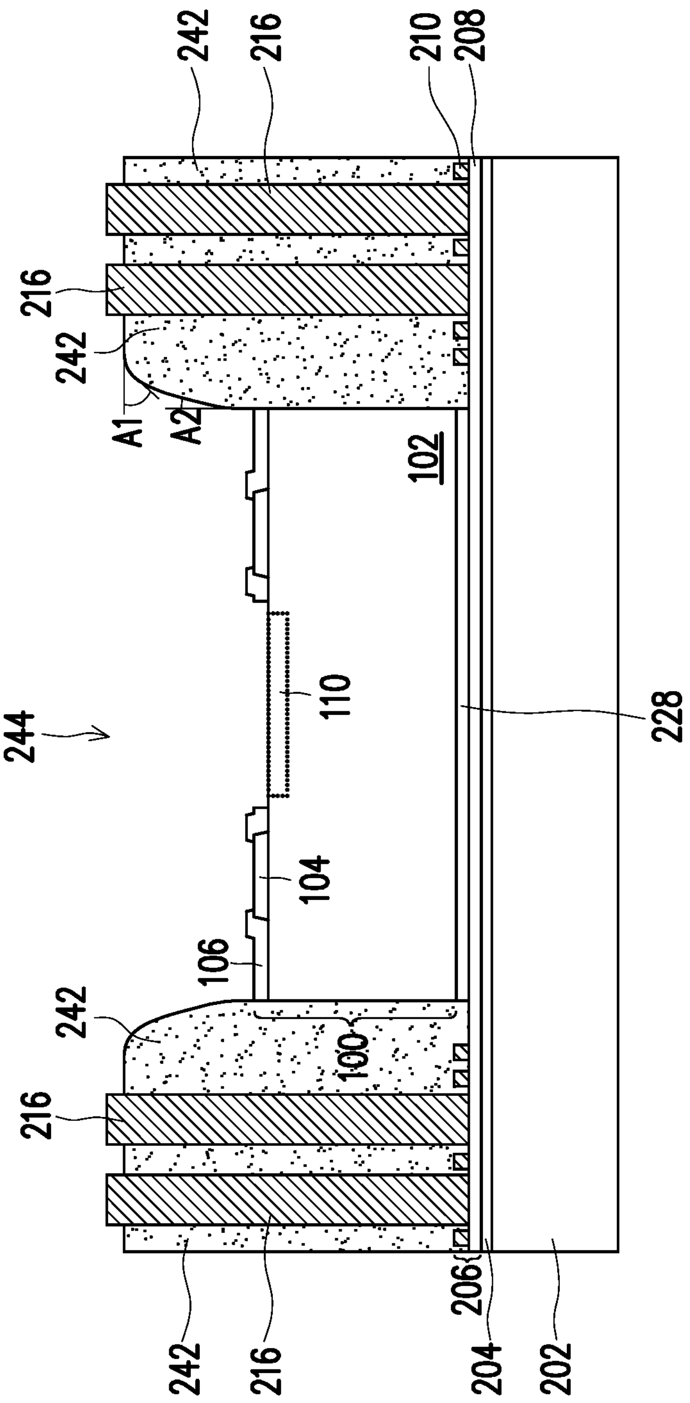

Turning to FIG. 10, a dry etching process is performed to remove the sacrificial layer 112 from the structure shown in FIG. 9, in accordance with some embodiments. As shown in FIG. 10, the dry etching process removes the sacrificial layer 112 from over the sensor die 100, forming a recess 244 in the encapsulant 242 that exposes the sensor region 110 and the pads 104 of the sensor die 100. In some cases, the dry etching process also etches portions of the encapsulant 242, which can form a recess 244 having sloped sidewalls, as shown in FIG. 10. In some embodiments, upper portions of the sidewalls of the recess 244 may have an angle A1 with respect to a lateral direction that is between about 5 degrees and about 60 degrees. In some embodiments, lower portions of the sidewalls of the recess 244 may have an angle A2 with respect to a vertical direction that is between about 0 degrees and about 15 degrees. In some cases, by forming a recess 244 having sloped sidewalls, subsequently formed layers such as dielectric layer 246 (described below) may have a more uniform topography, which can reduce photolithography variation (e.g., of openings 248, 250, and 252, described below) and reduce thickness variation in subsequently formed conductive features (e.g., metallization pattern 256, described below).

In some embodiments, the dry etching process includes a plasma etching process. The plasma etching process may include, for example, forming a plasma of oxygen, argon, $CF_4$, $CHF_3$, $SF_6$, the like, or a combination. In some embodiments, the plasma etching process includes an ion bombardment process. In some embodiments, the plasma etching process is performed using a power between about 100 Watts and about 1000 Watts. Other process gases, powers, or other process conditions are possible.

In some cases, the dry etching process etches the encapsulant 242 such that the conductive vias 216 protrude above the encapsulant 242, as shown in FIG. 10. In some cases, the conductive vias 116 may protrude between about 0.5 μm and about 5 μm above the encapsulant 242. In some cases, surfaces of the encapsulant 242 are roughened by the dry etching process as those surfaces are etched by the dry etching process. In some cases, the dry etching process roughens surfaces of the passivation films 106 after those surfaces of the passivation films 106 have been exposed by the dry etching process. In some cases, after performing the dry etching process, the roughness of the surfaces of the encapsulant 242 and/or the roughness of the surfaces of the passivation films 106 may be between about Ra=1 μm and about Ra=10 μm. For example, the roughness of the surfaces of the passivation films 106 may be about Ra=1.03 μm, though other amounts of roughness are possible. After performing the dry etching process, the encapsulant 242 may have a wavy surface. Additionally, the dry etching process may expose filler material of the encapsulant 242, and the exposed filler material may have rounded or roughened exposed surfaces due to the dry etching process. In some embodiments, a cleaning process (e.g. a wet chemical process, rinse, or the like) may be performed after the dry etching process to remove residue or particulates. In some embodiments, a cleaning process is not performed after the dry etching process.

FIGS. 11 through 16 illustrate formation of a front-side redistribution structure 264 (see FIG. 16) over the conductive vias 216, encapsulant 242, and sensor die 100, in accordance with some embodiments. The front-side redistribution structure 264 includes a dielectric layer 246, a metallization pattern 256, and a dielectric layer 262. The metallization patterns may also be referred to as redistribution layers or redistribution lines. The front-side redistribution structure 264 is shown as an example, and one example process to form the front-side redistribution structure 264 is discussed herein. More or fewer dielectric layers and metallization patterns may be formed in the front-side redistribution structure 264. If more dielectric layers and metallization patterns are to be formed, steps and processes discussed below may be repeated. The front-side redistribution structure 264 as described herein may be used to electrically connect conductive features (e.g., conductive vias 216) to the sensor die 100. By forming a front-side redistribution structure 264 as described herein, a sensor package may be formed having a smaller size (e.g., thickness or area). For example, a front-side redistribution structure 264 may be used to form electrical connections in a sensor package instead of using a wire bonding technique. The front-side redistribution structure 264 may have a smaller overall thickness than wire bonds, resulting in a thinner sensor package. Additionally, the use of a relatively thin front-side redistribution structure 264 can allow the sensor region 110 of the sensor die 100 to be closer to the external surface of the sensor package. This allows the sensor region 110 to be closer to the environment that is to be sensed, which can improve sensitivity and response speed of the sensing operation.

Figure 11:
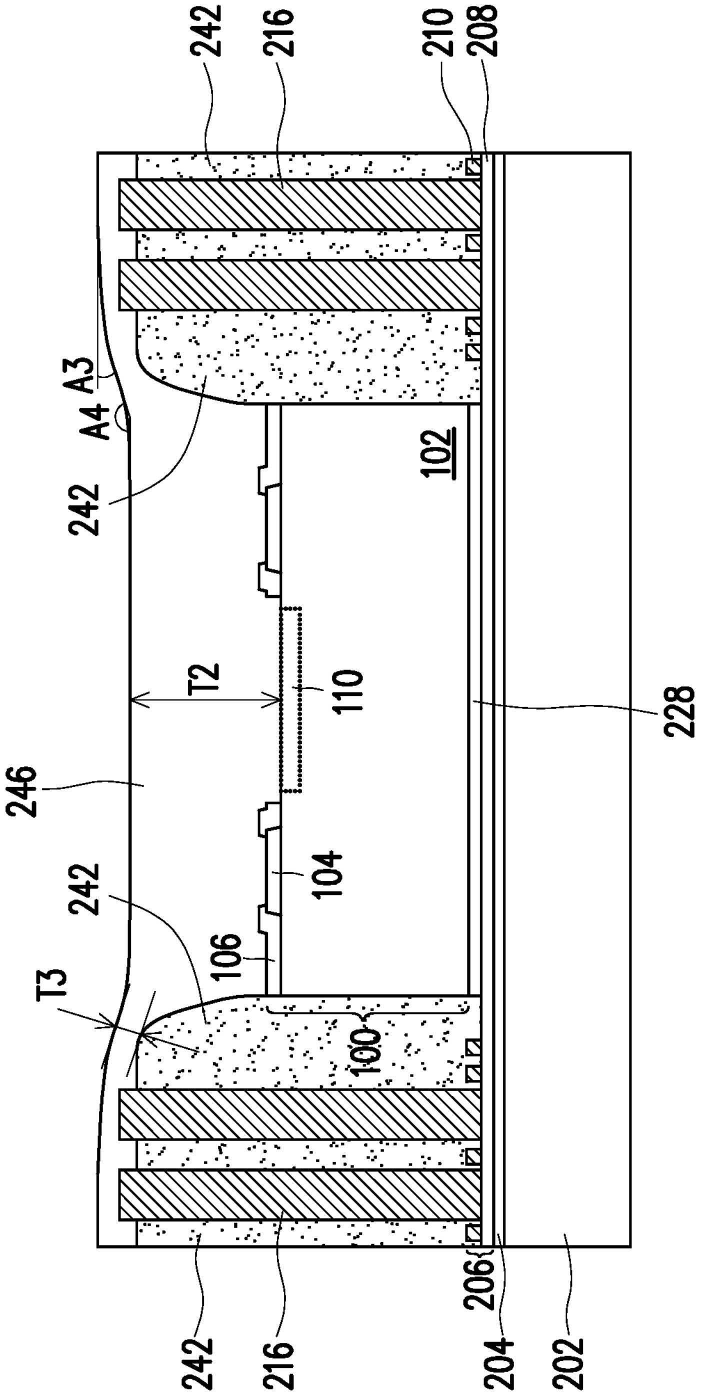

In FIG. 11, the dielectric layer 246 is deposited over the structure, in accordance with some embodiments. In some embodiments, the dielectric layer 246 is formed of a material such as PBO, polyimide, BCB, or the like. In some embodiments, the dielectric layer 246 is formed of a photo-sensitive material which may be patterned using a lithography mask. The dielectric layer 246 may be formed by spin coating, lamination, CVD, the like, or a combination thereof. As shown in FIG. 11, the top surfaces of the dielectric layer 246 may be higher in regions over the encapsulant 242 and lower in regions over the sensor die 100. In other embodiments, the top surfaces of the dielectric layer 246 over the encapsulant 242 and over the sensor die 100 are approximately level. In some embodiments, the dielectric layer 246 may have a thickness T2 above the sensor die 100 that is between about 2 μm and about 50 μm. In some embodiments, the dielectric layer 246 above the sensor die 100 may have a height above the back-side redistribution structure 206 that is less than a height of the encapsulant 242 above the back-side redistribution structure 206. In other words, the thickness T2 may be such that a top surface of the dielectric layer 246 is below a top surface of the encapsulant 242. In some embodiments, a thickness T3 between an upper corner region of the encapsulant 242 and a top surface of the dielectric layer 246 is between about 2 μm and about 10 μm. In some cases, a sufficient thickness of the dielectric layer 246 near the upper corners of the encapsulant 242 can reduce thickness variation in subsequently formed conductive features (e.g., metallization pattern 256, described below). In some cases, due to the roughness of the encapsulant 242, the dielectric layer 246 over the encapsulant 242 may have a roughness between about Ra=2 μm and about Ra=7 μm.

As shown in FIG. 11, regions of the dielectric layer 246 extending approximately from over the encapsulant 242 to over the sensor die 100 may have sloped top surfaces. In some embodiments, upper regions of the sloped top surfaces may have an angle A3 with respect to a lateral direction that is between about 20 degrees and about 60 degrees. In some embodiments, lower portions of the sloped top surfaces may have an angle A4 with respect to a top surface of the dielectric layer 246 over the sensor die 100 that is between about 105 degrees and about 170 degrees. In some cases, by forming the dielectric layer 246 having sloped top surfaces extending over the encapsulant 242 and the sensor die 100, subsequently formed layers such as dielectric layer 262 (described below) may have a more uniform topography and may reduce thickness variation in subsequently formed conductive features (e.g., metallization pattern 256, described below).

Figure 12:
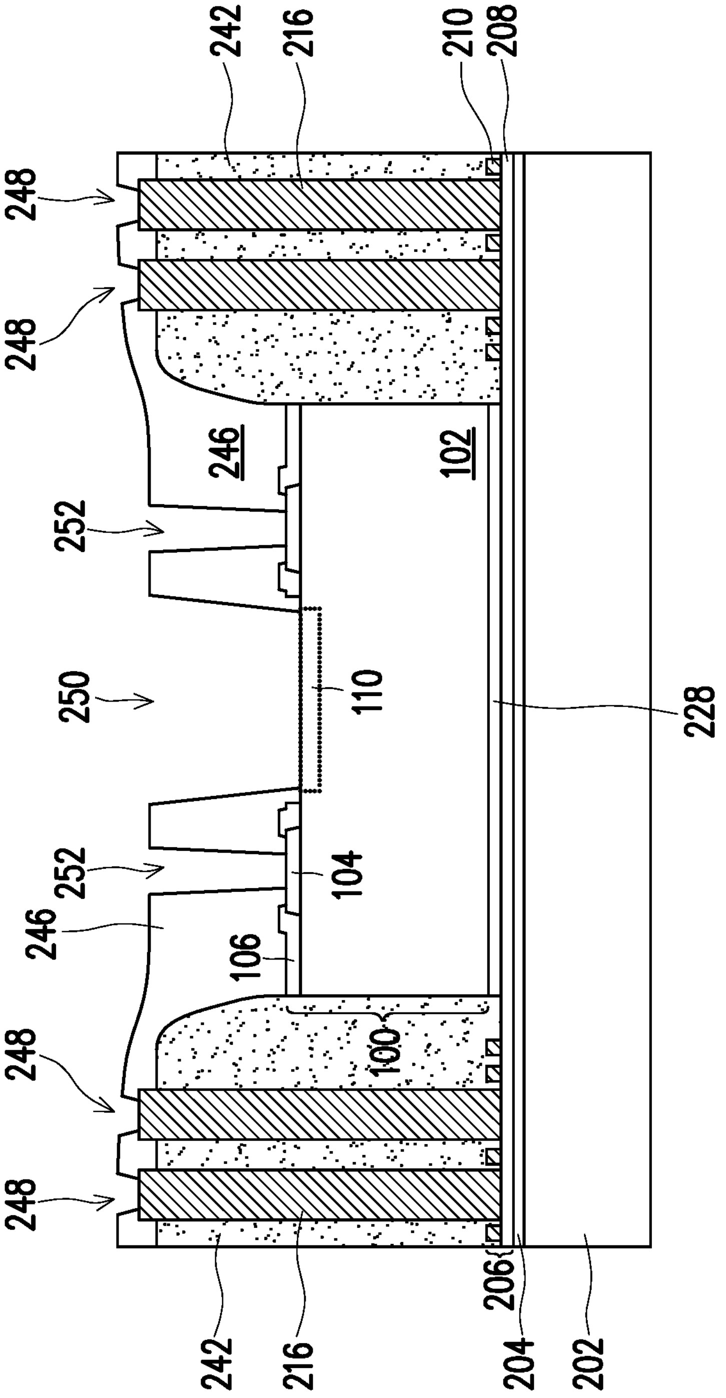

In FIG. 12, the dielectric layer 246 is patterned to form openings 248, 250, and 252, in accordance with some embodiments. The openings 248 are formed to expose the conductive vias 216, the opening 250 is formed to expose the sensor region 110 of the sensor die 100, and the openings 252 are formed to expose the pads 104 of the sensor die 100. The patterning may be performed using an acceptable photolithography process, such as by exposing the dielectric layer 246 to light when the dielectric layer 246 is a photosensitive material and developing the dielectric layer 246. The patterning may alternatively be performed by forming a patterned mask over the dielectric layer 246 and then etching the dielectric layer 246 using, for example, an anisotropic etch.

Figure 13:
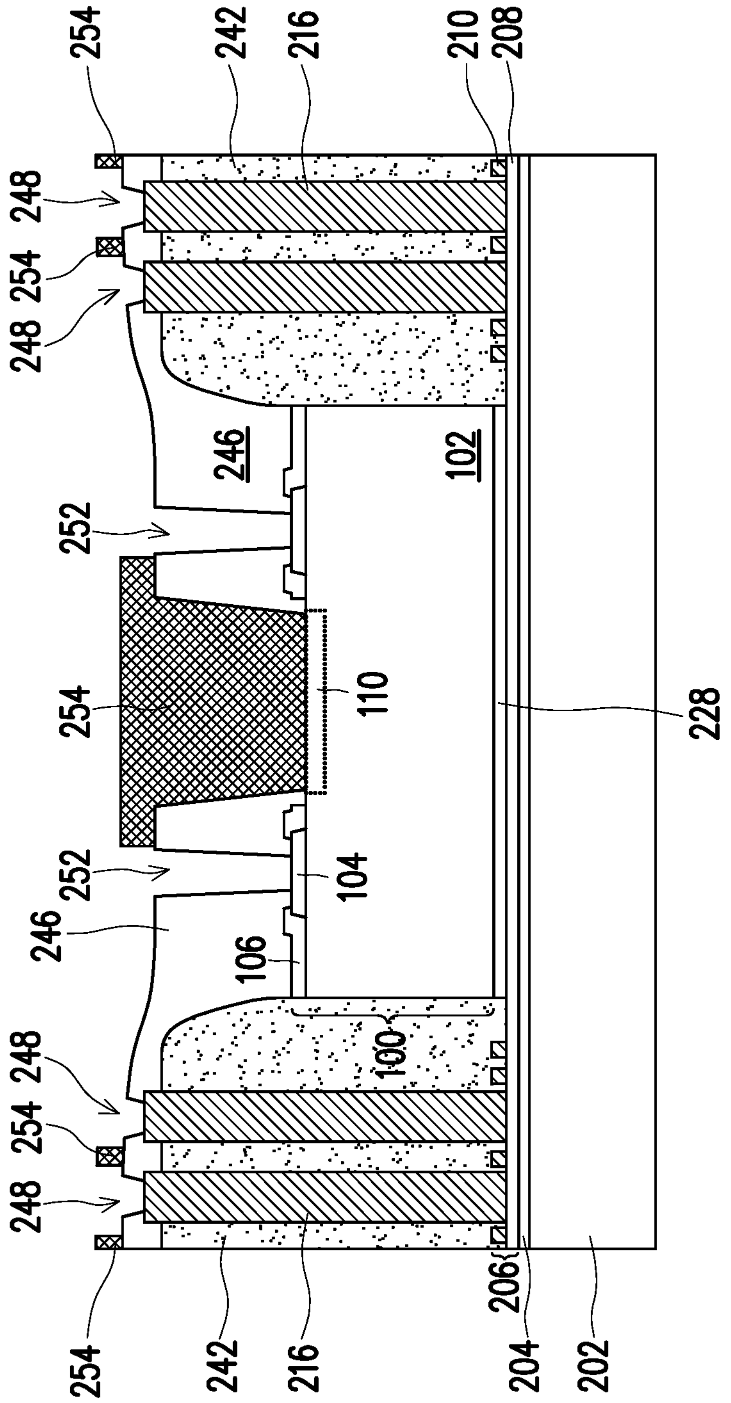
Figure 14:
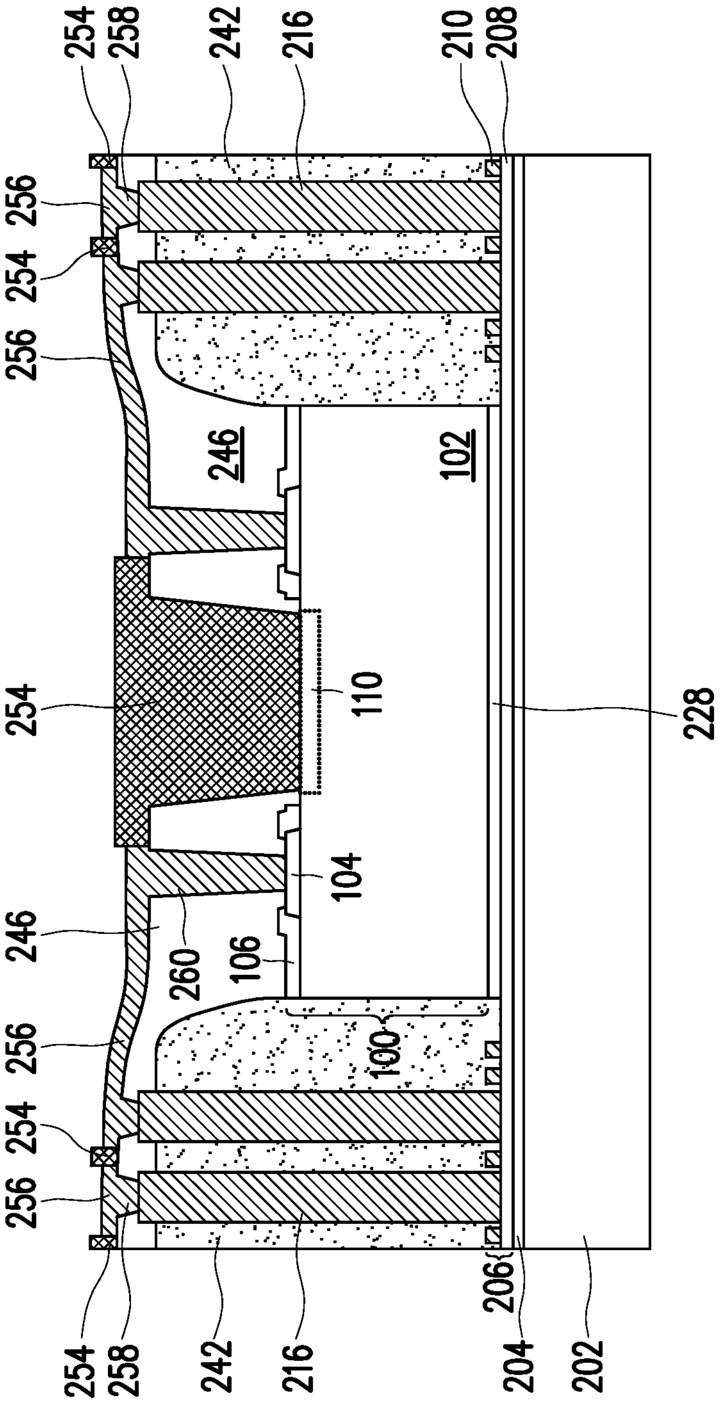
Figure 15:
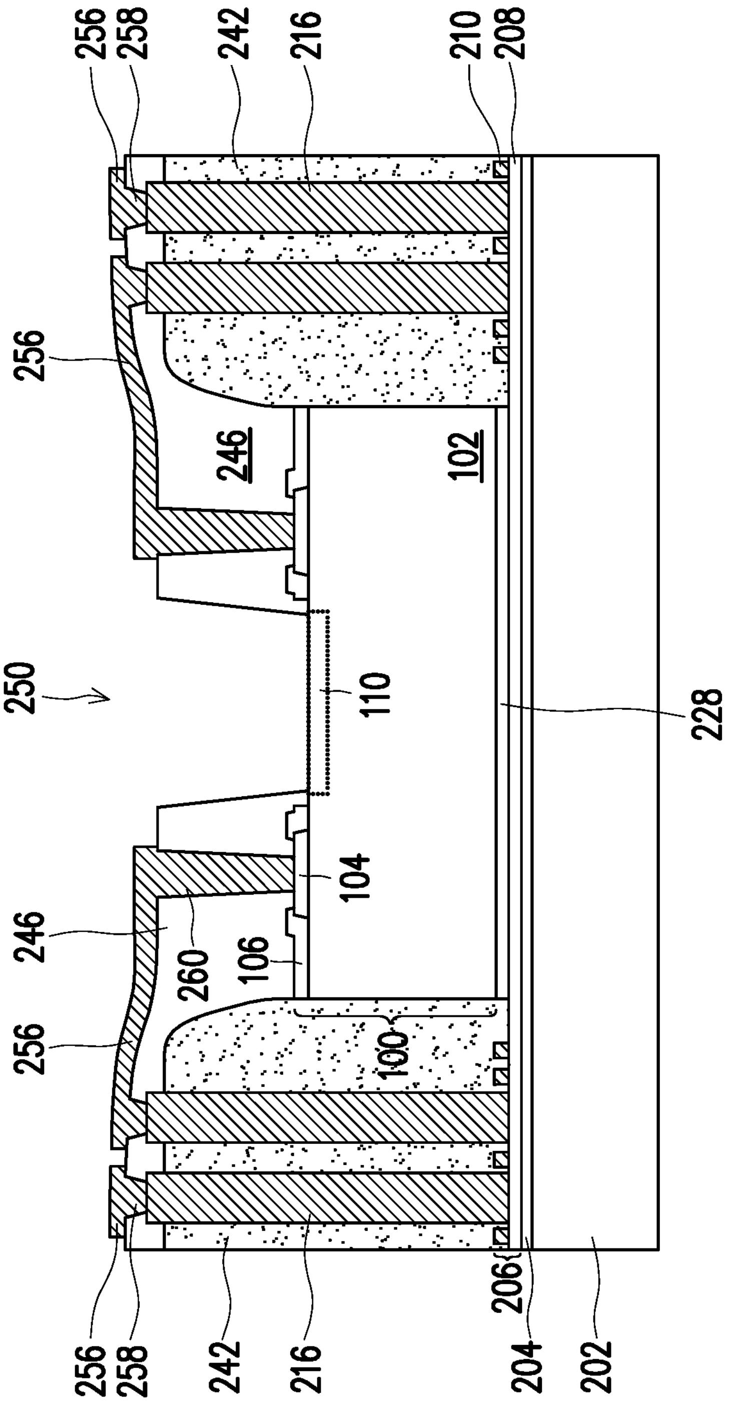

In FIGS. 13 through 15, the metallization pattern 256 of the front-side redistribution structure 264 is formed, in accordance with some embodiments. To form the metallization pattern 256, a seed layer (not shown) is first formed over the dielectric layer 246 and in the openings 248, 250, and 252 extending through the dielectric layer 246. In some embodiments, the seed layer is a metal layer, which may be a single layer or a composite layer including a plurality of sub-layers formed of different materials. In some embodiments, the seed layer is a titanium layer and a copper layer over the titanium layer. The seed layer may be formed using, for example, PVD or the like.

Referring to FIG. 13, a photoresist 254 is then formed over the seed layer and patterned, in accordance with some embodiments. The photoresist 254 may be formed by spin coating, lamination, or the like. The patterning of the photoresist 254 may be performed using an acceptable photolithography process, such as by exposing the photoresist 254 to light and developing the dielectric layer 246. The patterning forms openings through the photoresist 254 to expose regions of the seed layer corresponding to the metallization pattern 256. As shown in FIG. 13, the photoresist 254 may be patterned to expose the conductive vias 216 through the openings 248 and the contact pads 104 through the openings 252. The opening 250 may remain at least partially filled by the photoresist 254 to protect the sensor region 110 of the sensor die 100.

Turning to FIG. 14, a conductive material is then formed in the openings of the photoresist 254 and on the exposed portions of the seed layer, in accordance with some embodiments. The conductive material may be formed by plating, such as electroplating or electroless plating, or the like. The conductive material may be a metal, like copper, titanium, tungsten, aluminum, the like, or combinations thereof. In some cases, the conductive material may be formed having different thicknesses in different regions. For example, portions of the conductive material over the sensor die 100 may have a greater thickness than portions of the conductive material over the encapsulant 242. The combination of the conductive material and underlying portions of the seed layer form the metallization pattern 256. The metallization pattern 256 includes conductive lines on and extending along the major surface of the dielectric layer 246. The metallization pattern 256 further includes conductive vias 258 extending through the dielectric layer 246 to be physically and electrically connected to the conductive vias 216, and conductive vias 260 extending through the dielectric layer 246 to be physically and electrically connected to the contact pads 104 of the sensor die 100.

Turning to FIG. 15, the photoresist 254 and portions of the seed layer on which the conductive material is not formed are then removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. Removing the photoresist 254 and the seed layer exposes the sensor region 110 through the opening 250 in the dielectric layer 246.

Figure 16:
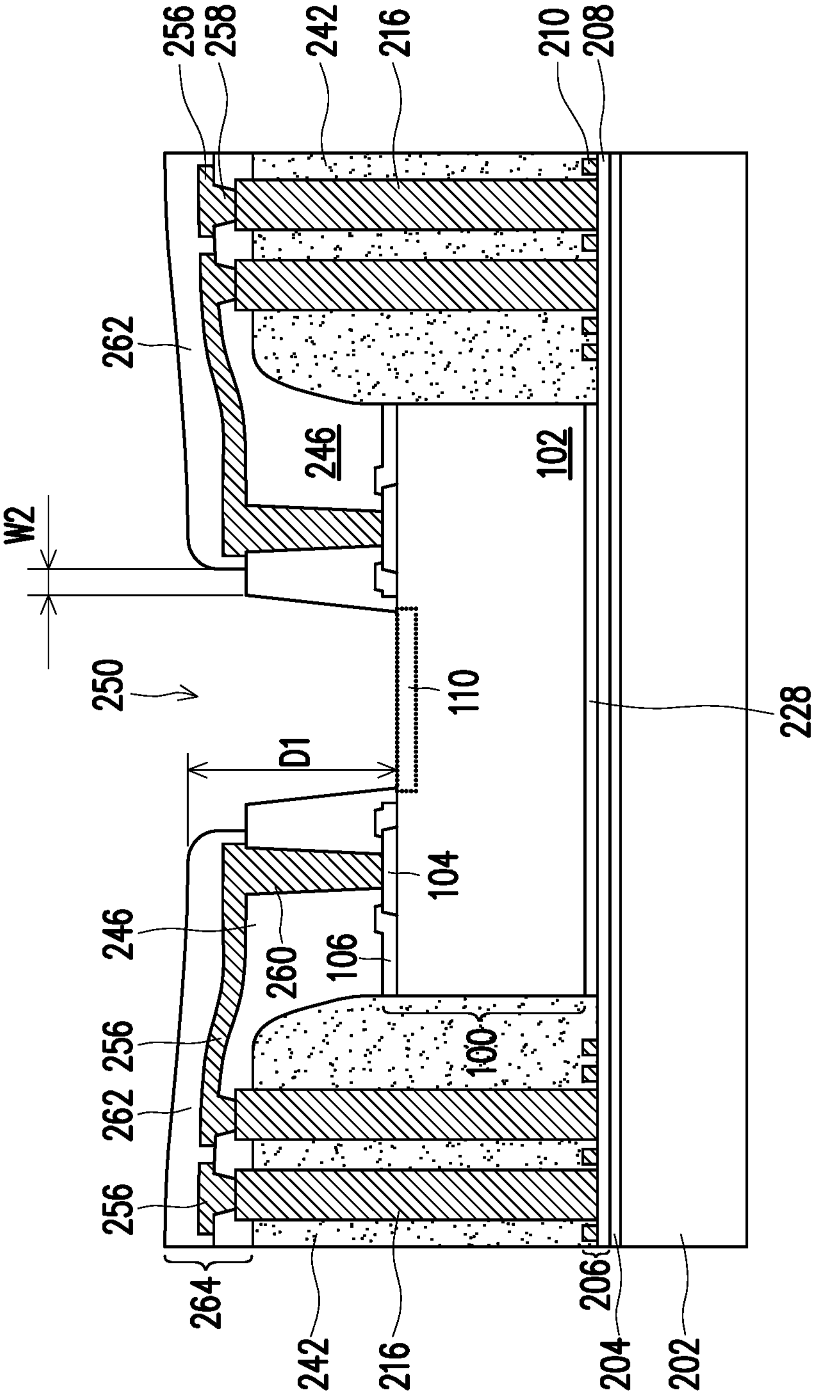

In FIG. 16, the dielectric layer 262 is deposited on the metallization pattern 256 and dielectric layer 246 and patterned to form the front-side redistribution structure 264, in accordance with some embodiments. The dielectric layer 262 may be formed in a manner similar to the dielectric layer 246, and may be formed of the same material as the dielectric layer 246. The dielectric layer 262 is patterned to expose the sensor region 110 of the sensor die 100. In this manner, the opening 250 is extended through the dielectric layer 262. The patterning of the dielectric layer 262 may be performed in a similar manner as the patterning of the dielectric layer 246. After patterning the dielectric layer 262, the opening 250 has a depth $D_1$ extending from a major surface of the dielectric layer 262 to a topmost surface of the sensor die 100. In some embodiments, the depth $D_1$ is in a range between about 2 μm and about 100 μm.

The opening 250 extends through the dielectric layers 246 and 262 of the front-side redistribution structure 264. The metallization pattern 256 is not formed in the opening 250, such that the opening 250 is free from the materials of the front-side redistribution structure 264 (e.g., materials of the metallization pattern 256 and the dielectric layers 246 and 262). In some embodiments, the dielectric layer 262 is patterned such that the portion of the opening 250 extending through the dielectric 262 has a larger width than the portion of the opening extending through the dielectric layer 246. For example, the sidewall of the dielectric layer 262 may be offset from the sidewall of the dielectric layer 246 by a width $W_2$ that is between about 0 μm and about 100 μm, such as about 20 μm. In some cases, a larger offset can allow for greater exposure of the sensor region 110 to the sensed environment, which can increase sensitivity and responsiveness of the sensing operation.

Figure 17:
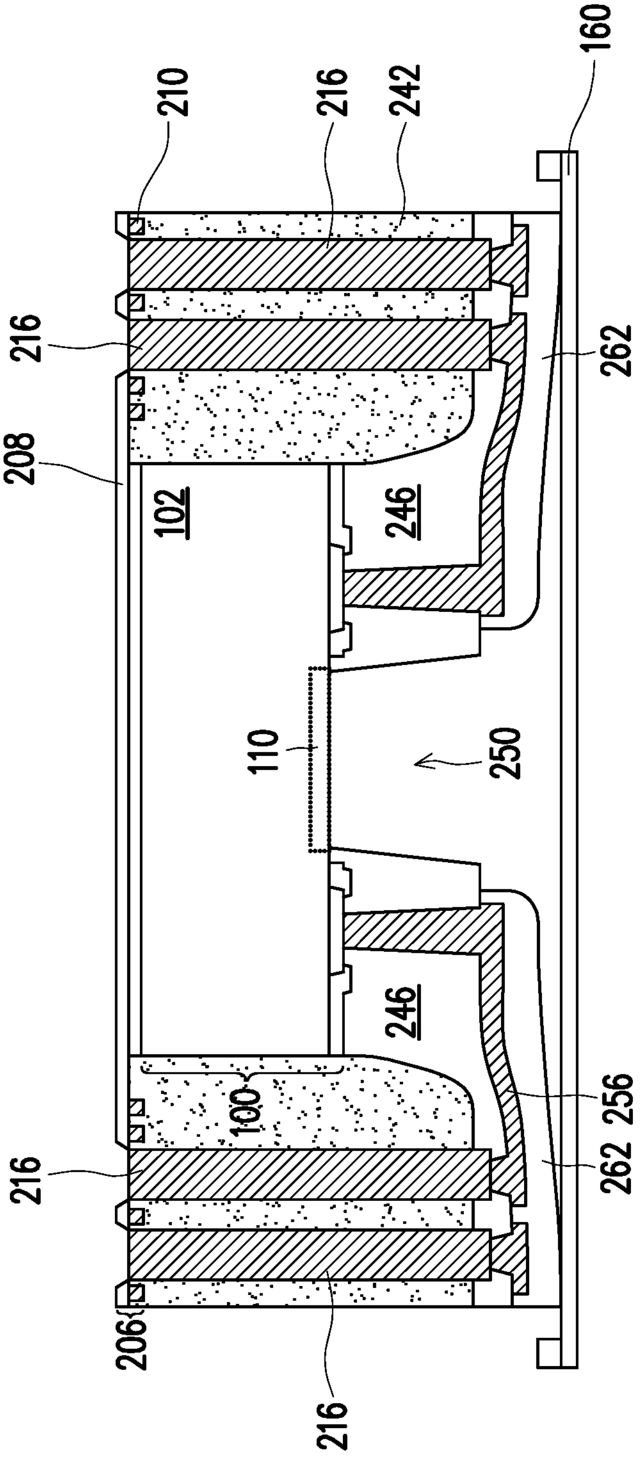

In FIG. 17, a carrier substrate de-bonding process is performed to detach (or “de-bond”) the carrier substrate 202 from the adhesive 228 and the back-side redistribution structure 206 (e.g., the dielectric layer 208). Openings are then formed through the dielectric layer 208 to expose portions of the metallization pattern 210 and/or conductive vias 216, in accordance with some embodiments. In some embodiments, the de-bonding process includes projecting a light such as a laser light or an UV light on the release layer 204 so that the release layer 204 decomposes under the heat of the light and the carrier substrate 202 can be removed. The structure is then flipped over and placed on a tape 160. The openings in the dielectric layer 208 may be formed, for example, using laser drilling, etching, or the like. A cleaning process may be performed after a laser drilling process, to remove remaining residue (e.g., of the dielectric layer 208).

Figure 18:
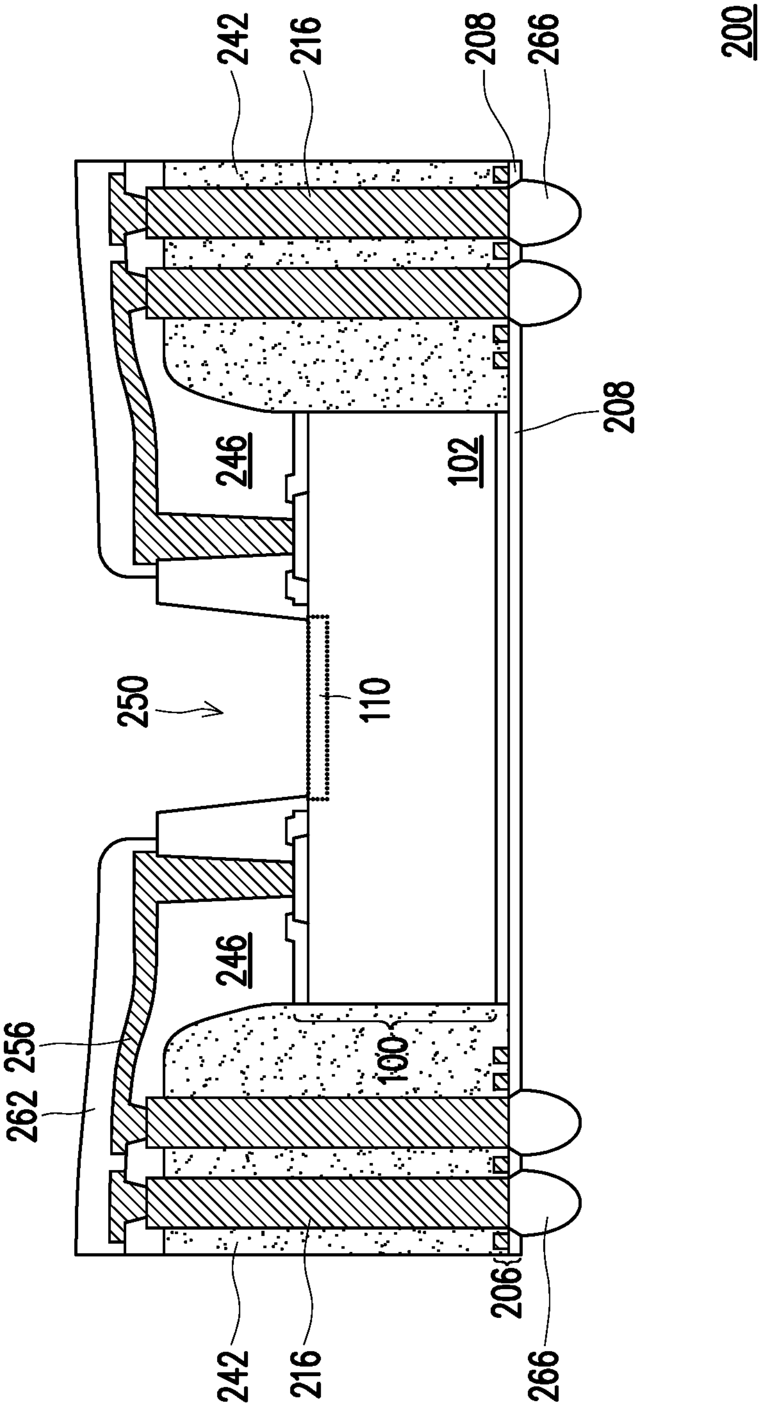
Figure 19:
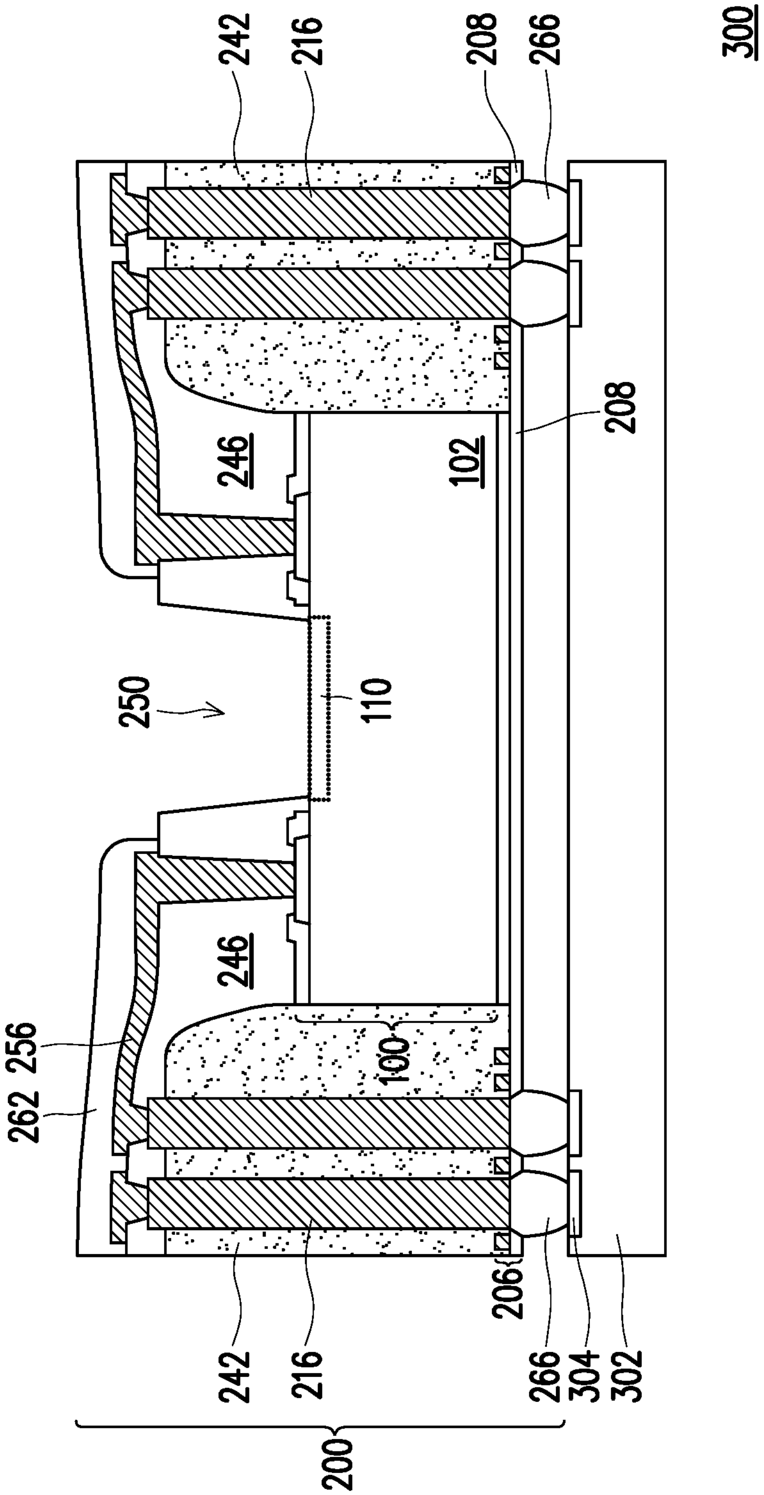
FIG. 19 illustrates a cross-sectional view of an intermediate step during a process for forming a sensor device, in accordance with some embodiments.

In FIG. 18, conductive connectors 266 are formed in the openings in the dielectric layer 208 to form the sensor package 200, in accordance with some embodiments. The conductive connectors 266 may be physically and electrically connected to the metallization pattern 210 and/or conductive vias 216. The conductive connectors 266 may include a conductive material such as solder, copper, aluminum, gold, nickel, silver, palladium, tin, the like, or a combination thereof. In some embodiments, the conductive connectors 266 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In some embodiments, the conductive connectors 266 include flux and are formed in a flux dipping process. In some embodiments, the conductive connectors 266 include a conductive paste such as solder paste, silver paste, or the like, and are dispensed in a printing process.

In some embodiments, multiple sensor packages 200 are formed on a single carrier substrate 202, and a singulation process is performed to form individual sensor packages 200. The singulation process may be, for example, sawing, laser drilling, or the like. By forming a sensor package 200 as described herein (e.g., using a sacrificial layer 112 and removing the sacrificial layer 112 using a dry etching process), the thickness of the sensor package 200 may be reduced. Additionally, the sensor region 110 may be formed closer to the top of the sensor package 200 (e.g., the top of the dielectric layer 262), which can improve sensing performance.

In FIG. 19, the sensor package 200 is mounted to a package substrate 302 using the conductive connectors 266 to form a sensor device 300, in accordance with some embodiments. The package substrate 302 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 302 may be a SOI substrate. Generally, a SOI substrate includes a layer of a semiconductor material such as epitaxial silicon, germanium, silicon germanium, SOI, SGOI, or combinations thereof. The package substrate 302 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 302.

The package substrate 302 may include active and passive devices (not shown). As one of ordinary skill in the art will recognize, a wide variety of devices such as transistors, capacitors, resistors, combinations of these, and the like may be used to generate the structural and functional requirements of the design for the sensor device 300. The devices may be formed using any suitable methods.

The package substrate 302 may also include metallization layers and vias (not shown) and bond pads 304 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 302 is substantially free of active and passive devices.

In some embodiments, the conductive connectors 266 are reflowed to attach the sensor package 200 to the bond pads 304. The conductive connectors 266 electrically and/or physically connect the package substrate 302, including metallization layers in the package substrate 302, to the sensor package 200. In some embodiments, passive devices (e.g., surface mount devices (SMDs), not illustrated) may be attached to the sensor device 300 (e.g., bonded to the bond pads 304) prior to mounting on the package substrate 302. In such embodiments, the passive devices may be bonded to a same surface of the sensor device 300 as the conductive connectors 266.

The conductive connectors 266 may have an epoxy flux (not shown) formed thereon before they are reflowed, with at least some of the epoxy portion of the epoxy flux remaining after the sensor package 200 is attached to the package substrate 302. This remaining epoxy portion may act as an underfill to reduce stress and protect the joints resulting from the reflowing the conductive connectors 266. In some embodiments, an underfill (not shown) may be formed between the sensor package 200 and the package substrate 302, surrounding the conductive connectors 266. The underfill may be formed by a capillary flow process after the sensor package 200 is attached, or may be formed by a suitable deposition method before the sensor package 200 is attached.

FIGS. 20 through 28 illustrate the formation of a sensor package 400 and a sensor device 500, in accordance with some embodiments. The sensor package 400 (see FIG. 27) is a package incorporating the sensor die 100, and the sensor device 500 (see FIG. 28) is a device incorporating the sensor package 400, in accordance with some embodiments. The process shown in FIGS. 20 through 28 is similar to that shown in FIGS. 10 through 19 for forming the sensor package 200 and sensor device 300, except that a wet etching process is used to remove the sacrificial layer 112 from the sensor die 100. Accordingly, the material of the sacrificial layer 112 may be a material chosen to be removable by a wet etching process. In some cases, particular process steps or features of the embodiment shown in FIGS. 20 through 26 are similar to analogous process steps or features of the embodiment shown in FIGS. 10 through 19, and thus some details are not repeated.

Figure 20:
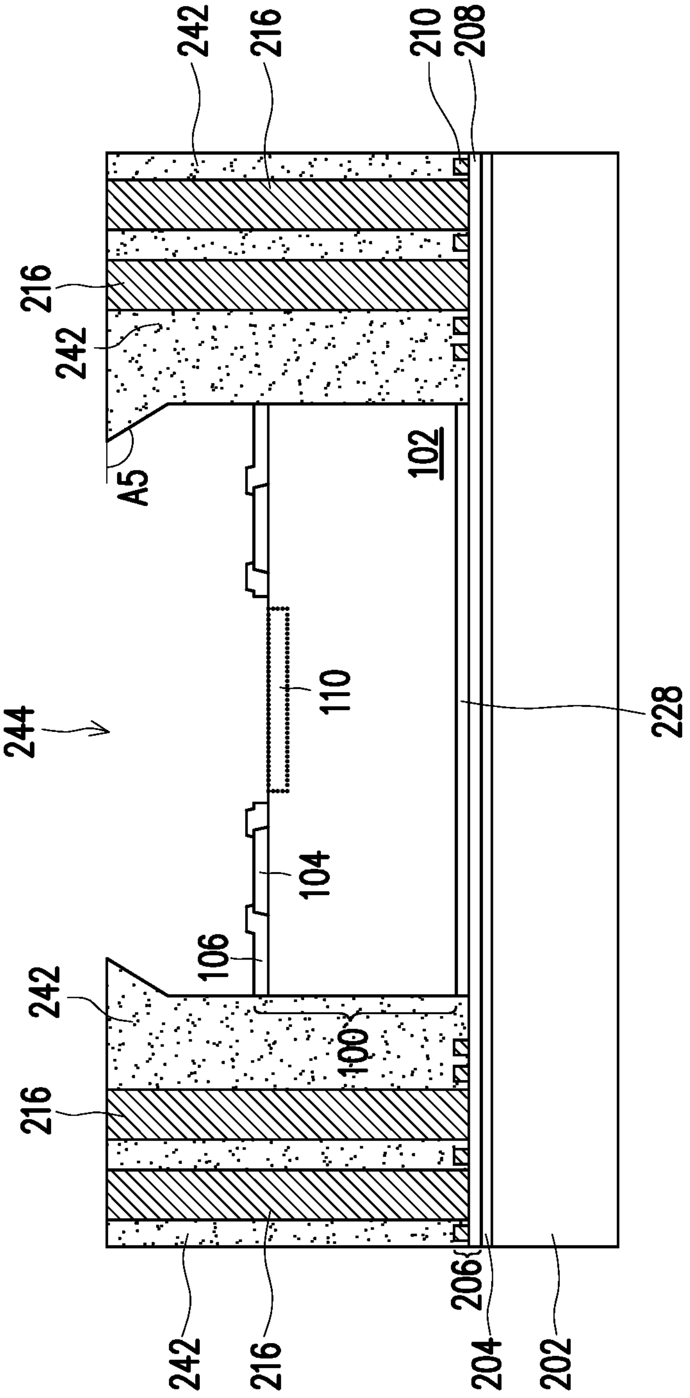
FIGS. 20 through 27 illustrate cross-sectional views of intermediate steps during a process for forming a sensor package using a wet etching process, in accordance with some embodiments.

Turning to FIG. 20, a wet etching process is performed to remove the sacrificial layer 112 of the structure shown in FIG. 9, in accordance with some embodiments. As shown in FIG. 20, the wet etching process removes the sacrificial layer 112 from over the sensor die 100, forming a recess 244 in the encapsulant 242 that exposes the sensor region 110 and the pads 104 of the sensor die 100. In some cases, the wet etching process etches portions of the encapsulant 242 very little or not at all, which can form a recess 244 having inwardly-sloped upper sidewalls, as shown in FIG. 20. In some embodiments, upper portions of the sidewalls of the recess 244 may have an angle $A_5$ with respect to a lateral direction that is between about 105 degrees and about 150 degrees. In some cases, by forming a recess 244 having inwardly-sloped upper sidewalls, subsequently formed layers such as dielectric layer 246 may have a more uniform topography, which can reduce photolithography variation (e.g., of openings 248, 250, and 252) and reduce thickness variation in subsequently formed conductive features (e.g., metallization pattern 256).

The wet etching process may include, for example, submerging the structure in a wet chemical mixture that comprises a solvent such as DMSO, NMP, IPA, or the like and one or more additives such as a Cu corrosion inhibitor, stabilizer, the like, or a combination thereof. In some embodiments, the wet chemical mixture may be at a temperature between about 25° C. and about 90° C. during the wet etching process, such as about 50° C. In some embodiments, the wet etching process may be performed for a duration of time between about 30 seconds and about 600 seconds, such as about 120 seconds. In some cases, performing the wet etching process for about 120 seconds may be sufficient to adequately etch the sacrificial layer 112, and a drying time of 10 minutes or less may be sufficient to dry the structure after performing the wet etching process. In some cases, the use of a wet etching process to remove the sacrificial layer 112 may reduce overall processing time or cost for a sensor package.

In some cases, after performing the wet etching process, the conductive vias 216 are recessed below the top surface of the encapsulant 242. In some cases, the conductive vias 216 may be recessed between about 0.7 μm and about 2 μm below the encapsulant 242. In some cases, the surfaces of the encapsulant 242 and/or the passivation films 106 maintain a low degree of roughness (e.g., Ra less than about 0.5 μm, such as about 0.03 μm) after the wet etching process is performed. In some embodiments, the surface of the encapsulant 242 is substantially flat after the wet etching process is performed. In some cases, the filler material of the encapsulant 242 is exposed by the wet etching process, and the exposed surfaces of the filler material are substantially flat after performing the wet etching process. In some embodiments, the wet etching process also acts as a cleaning process to remove residue or particles, and a separate cleaning process is not performed after the wet etching process.

FIGS. 21 through 26 illustrate formation of a front-side redistribution structure 264 (see FIG. 26) over the conductive vias 216, encapsulant 242, and sensor die 100, in accordance with some embodiments. The front-side redistribution structure 264 includes a dielectric layer 246, a metallization pattern 256, and a dielectric layer 262. The front-side redistribution structure 264 as described herein may be used to electrically connect conductive features (e.g., conductive vias 216) to the sensor die 100. By forming a front-side redistribution structure 264 as described herein, a sensor package may be formed having a smaller size (e.g., thickness or area). For example, a front-side redistribution structure 264 may be used to form electrical connections in a sensor package instead of using a wire bonding technique. The front-side redistribution structure 264 may have a smaller overall thickness than wire bonds, resulting in a thinner sensor package. Additionally, the use of a relatively thin front-side redistribution structure 264 can allow the sensor region 110 of the sensor die 100 to be closer to the external surface of the sensor package. This allows the sensor region 110 to be closer to the environment that is to be sensed, which can improve sensitivity and response speed of the sensing operation.

Figure 21:
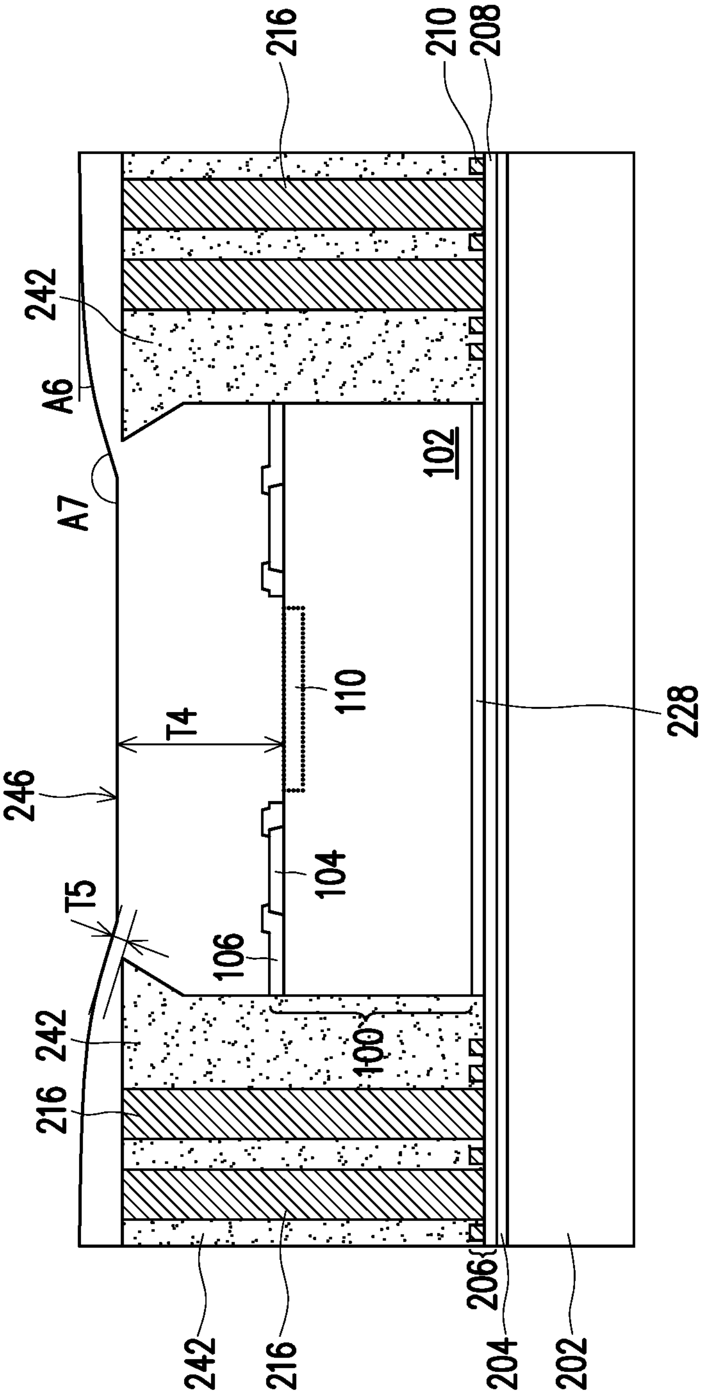

In FIG. 21, the dielectric layer 246 is deposited over the structure, in accordance with some embodiments. As shown in FIG. 21, the top surfaces of the dielectric layer 246 may be higher in regions over the encapsulant 242 and lower in regions over the sensor die 100. In other embodiments, the top surfaces of the dielectric layer 246 over the encapsulant 242 and over the sensor die 100 are approximately level. In some embodiments, the dielectric layer 246 may have a thickness $T_4$ above the sensor die 100 that is between about 5 μm and about 150 μm. In some embodiments, the dielectric layer 246 above the sensor die 100 may have a height above the back-side redistribution structure 206 that is less than a height of the encapsulant 242 above the back-side redistribution structure 206. In other words, the thickness $T_4$ may be such that a top surface of the dielectric layer 246 is below a top surface of the encapsulant 242. In some embodiments, a thickness $T_5$ between an upper corner region of the encapsulant 242 and a top surface of the dielectric layer 246 is between about 2 μm and about 10 μm. In some cases, a sufficient thickness of the dielectric layer 246 near the upper corners of the encapsulant 242 can reduce thickness variation in subsequently formed conductive features (e.g., metallization pattern 256). In some cases, the dielectric layer 246 over the encapsulant 242 may have a roughness less than about Ra=0.2 μm.

As shown in FIG. 21, regions of the dielectric layer 246 extending approximately from over the encapsulant 242 to over the sensor die 100 may have sloped top surfaces. In some embodiments, upper regions of the sloped top surfaces may have an angle $A_6$ with respect to a lateral direction that is between about 5 degrees and about 45 degrees. In some embodiments, lower portions of the sloped top surfaces may have an angle $A_7$ with respect to a top surface of the dielectric layer 246 over the sensor die 100 that is between about 105 degrees and about 170 degrees. In some cases, by forming the dielectric layer 246 having sloped top surfaces extending over the encapsulant 242 and the sensor die 100, subsequently formed layers such as dielectric layer 262 may have a more uniform topography and may reduce thickness variation in subsequently formed conductive features (e.g., metallization pattern 256).

Figure 22:
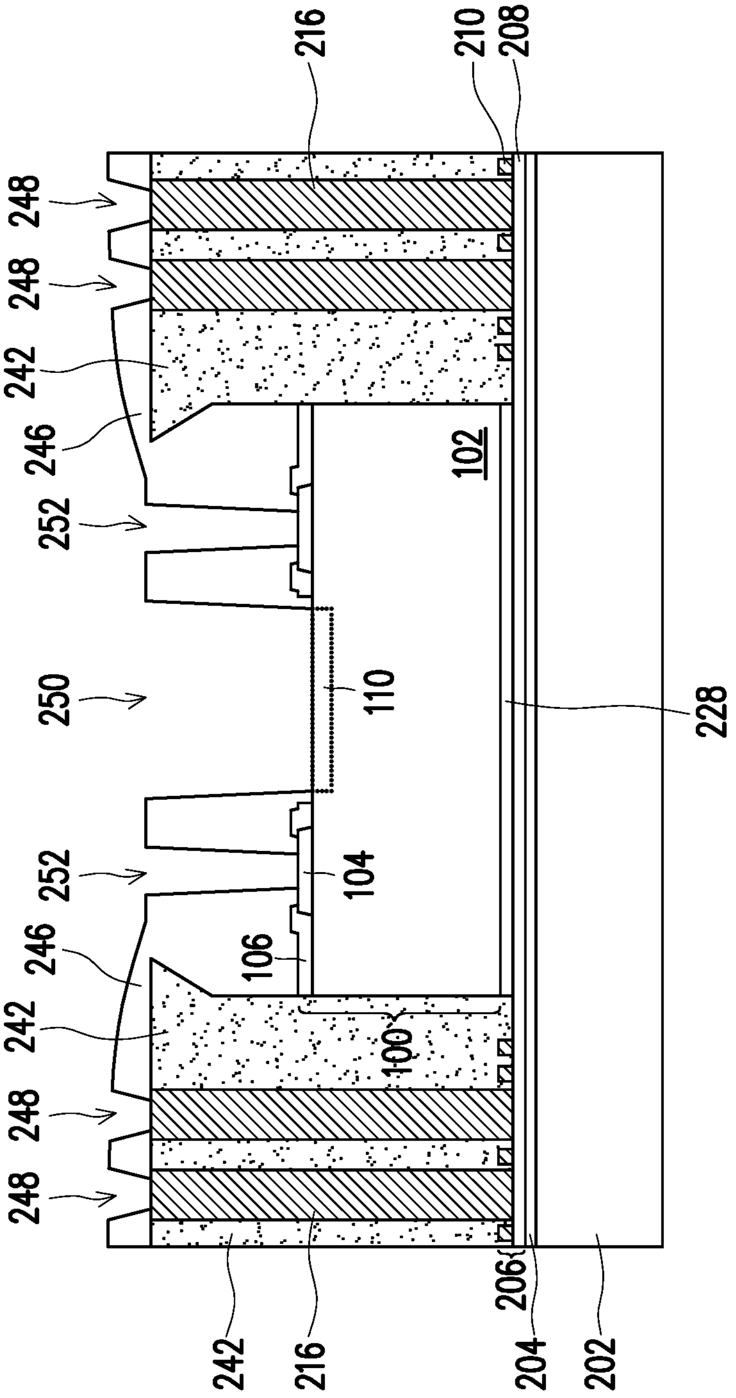

In FIG. 22, the dielectric layer 246 is patterned to form openings 248, 250, and 252, in accordance with some embodiments. The openings 248 are formed to expose the conductive vias 216, the opening 250 is formed to expose the sensor region 110 of the sensor die 100, and the openings 252 are formed to expose the pads 104 of the sensor die 100. The patterning may be performed using an acceptable photolithography process, such as by exposing the dielectric layer 246 to light when the dielectric layer 246 is a photosensitive material and developing the dielectric layer 246.

Figure 23:
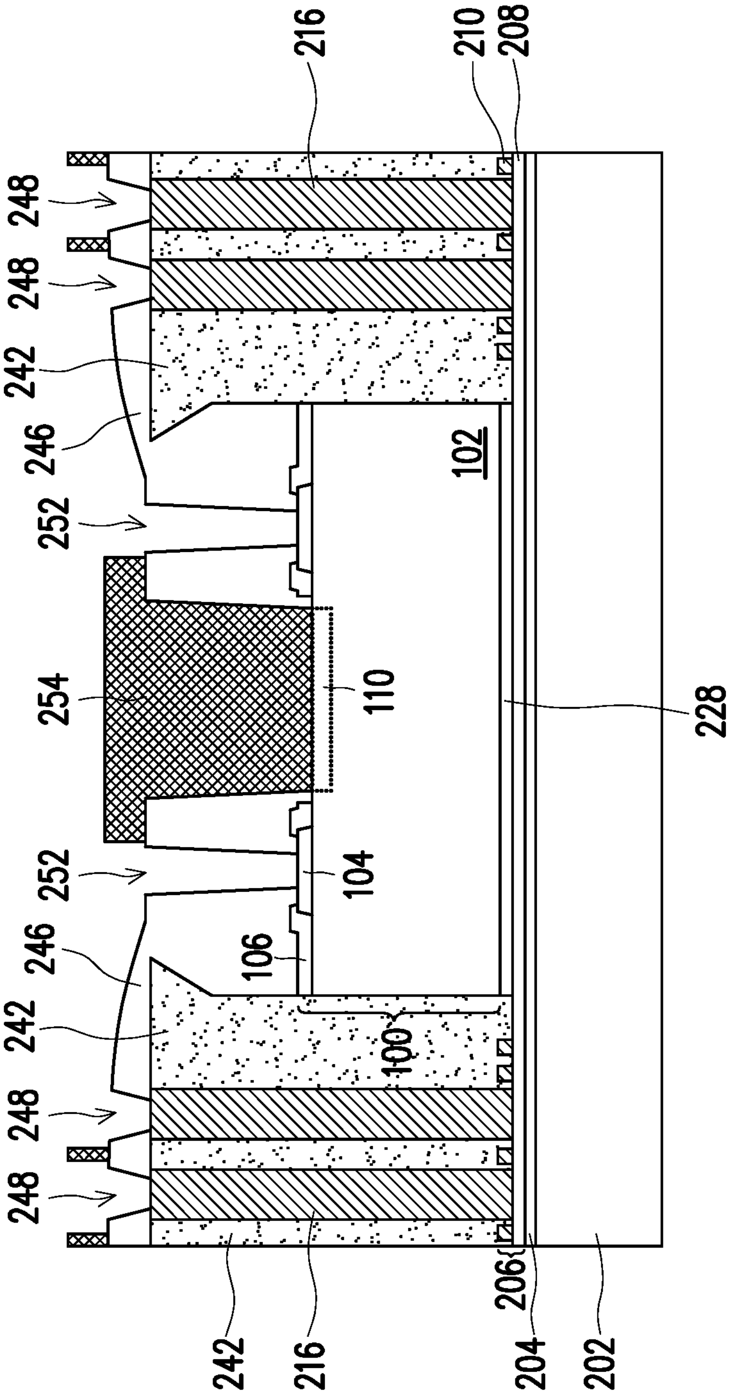
Figure 24:
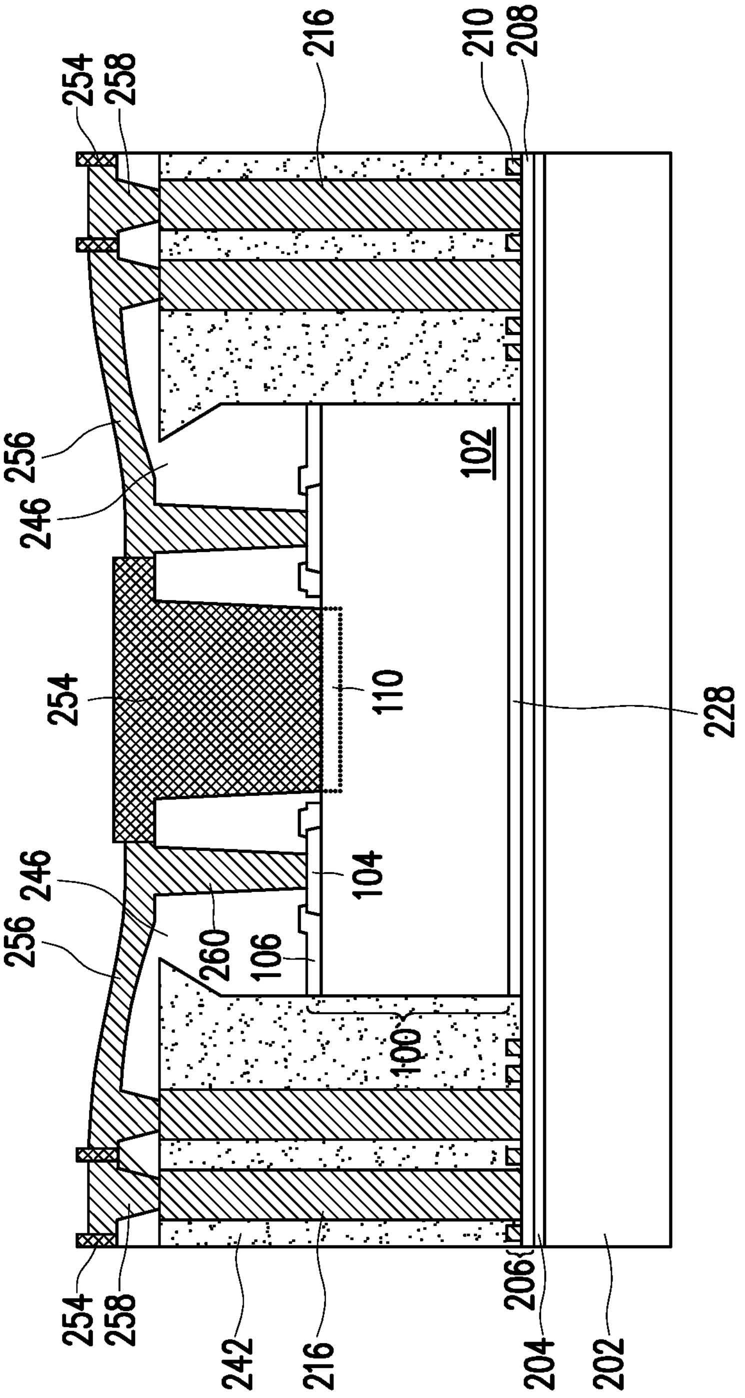
Figure 25:
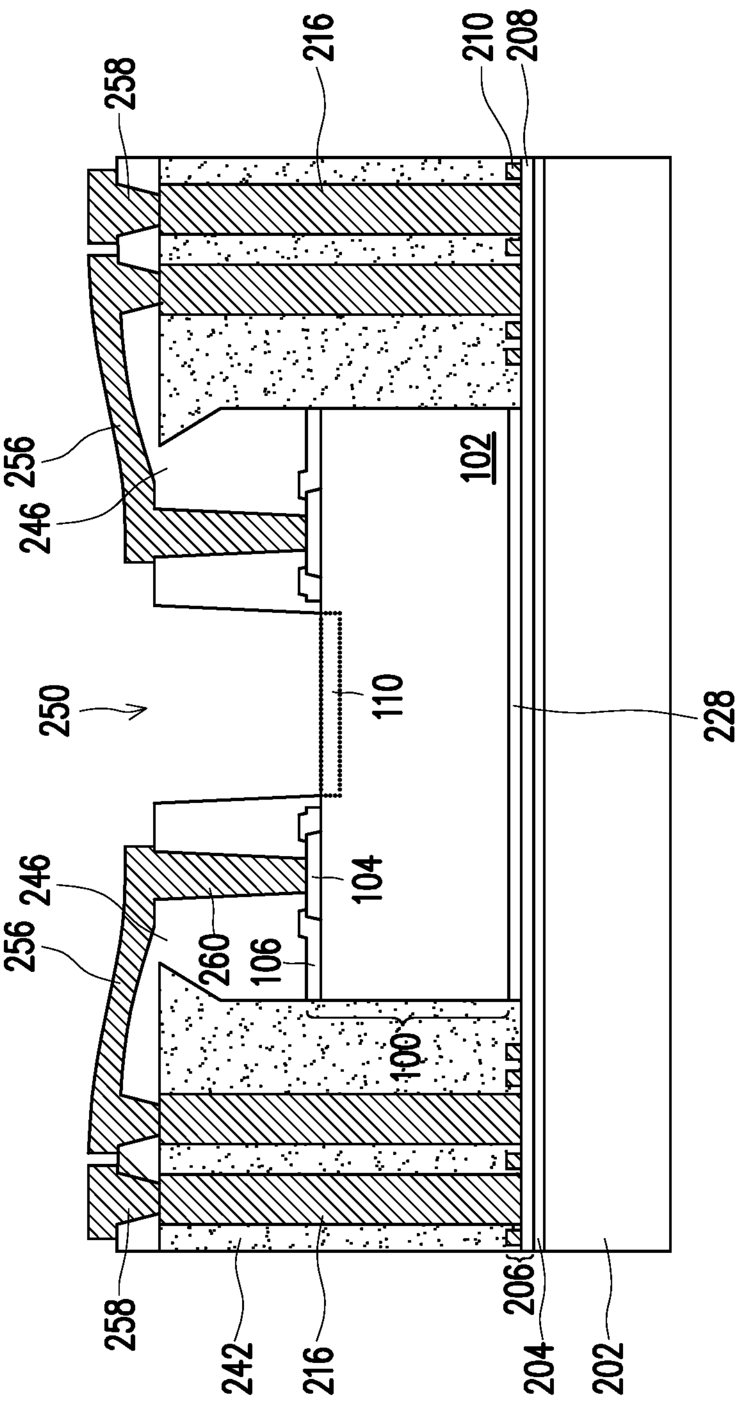

In FIGS. 23 through 25, the metallization pattern 256 of the front-side redistribution structure 264 is formed, in accordance with some embodiments. To form the metallization pattern 256, a seed layer (not shown) is first formed over the dielectric layer 246 and in the openings 248, 250, and 252 extending through the dielectric layer 246. Referring to FIG. 23, a photoresist 254 is then formed over the seed layer and patterned, in accordance with some embodiments. As shown in FIG. 23, the photoresist 254 may be patterned to expose the conductive vias 116 through the openings 248 and the contact pads 104 through the openings 252. The opening 250 may remain at least partially filled by the photoresist 254 to protect the sensor region 110 of the sensor die 100.

Turning to FIG. 24, a conductive material is then formed in the openings of the photoresist 254 and on the exposed portions of the seed layer, in accordance with some embodiments. The conductive material may be formed by plating, such as electroplating or electroless plating, or the like. The conductive material may be a metal, like copper, titanium, tungsten, aluminum, the like, or combinations thereof. In some cases, the conductive material may be formed having different thicknesses in different regions. For example, portions of the conductive material over the sensor die 100 may have a greater thickness than portions of the conductive material over the encapsulant 242. The combination of the conductive material and underlying portions of the seed layer form the metallization pattern 256. The metallization pattern 256 includes conductive lines on and extending along the major surface of the dielectric layer 246. The metallization pattern 256 further includes conductive vias 258 extending through the dielectric layer 246 to be physically and electrically connected to the conductive vias 216, and conductive vias 260 extending through the dielectric layer 246 to be physically and electrically connected to the contact pads 104 of the sensor die 100.

Turning to FIG. 25, the photoresist 254 and portions of the seed layer on which the conductive material is not formed are then removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. Removing the photoresist 254 and the seed layer exposes the sensor region 110 through the opening 250 in the dielectric layer 246.

Figure 26:
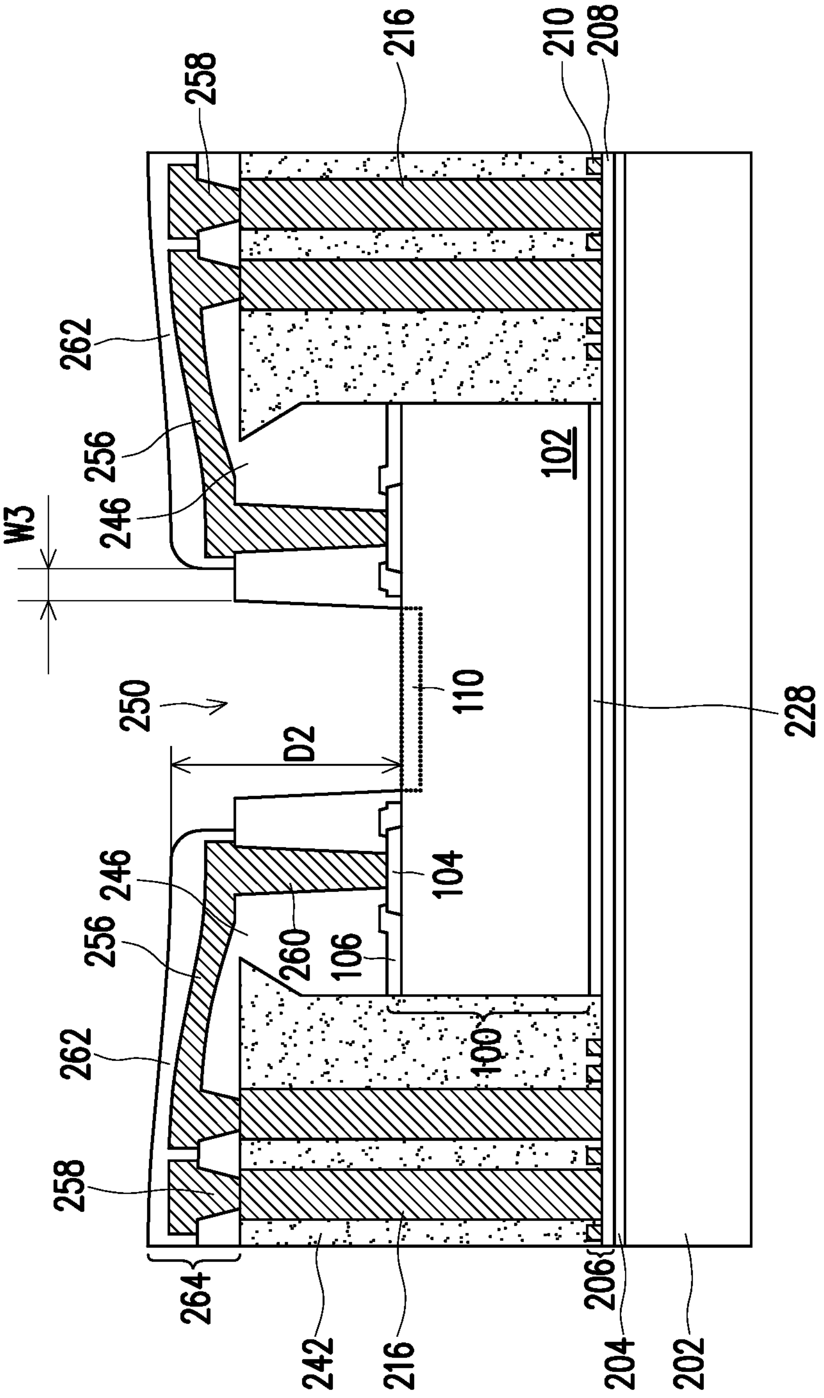

In FIG. 26, the dielectric layer 262 is deposited on the metallization pattern 256 and dielectric layer 246 and patterned to form the front-side redistribution structure 264, in accordance with some embodiments. The dielectric layer 262 may be formed in a manner similar to the dielectric layer 246, and may be formed of the same material as the dielectric layer 246. The dielectric layer 262 is patterned to expose the sensor region 110 of the sensor die 100. In this manner, the opening 250 is extended through the dielectric layer 262. After patterning the dielectric layer 262, the opening 250 has a depth $D_2$ extending from a major surface of the dielectric layer 262 to a topmost surface of the sensor die 100. In some embodiments, the depth $D_2$ is in a range between about 2 μm and about 100 μm.

The opening 250 extends through the dielectric layers 246 and 262 of the front-side redistribution structure 264. The metallization pattern 256 is not formed in the opening 250, such that the opening 250 is free from the materials of the front-side redistribution structure 264 (e.g., materials of the metallization pattern 256 and the dielectric layers 246 and 262). In some embodiments, the dielectric layer 262 is patterned such that the portion of the opening 250 extending through the dielectric 262 has a larger width than the portion of the opening extending through the dielectric layer 246. For example, the sidewall of the dielectric layer 262 may be offset from the sidewall of the dielectric layer 246 by a width $W_3$ that is between about 0 μm and about 50 μm, such as about 20 μm. In some cases, a larger offset can allow for greater exposure of the sensor region 110 to the sensed environment, which can increase sensitivity and responsiveness of the sensing operation.

Figure 27:
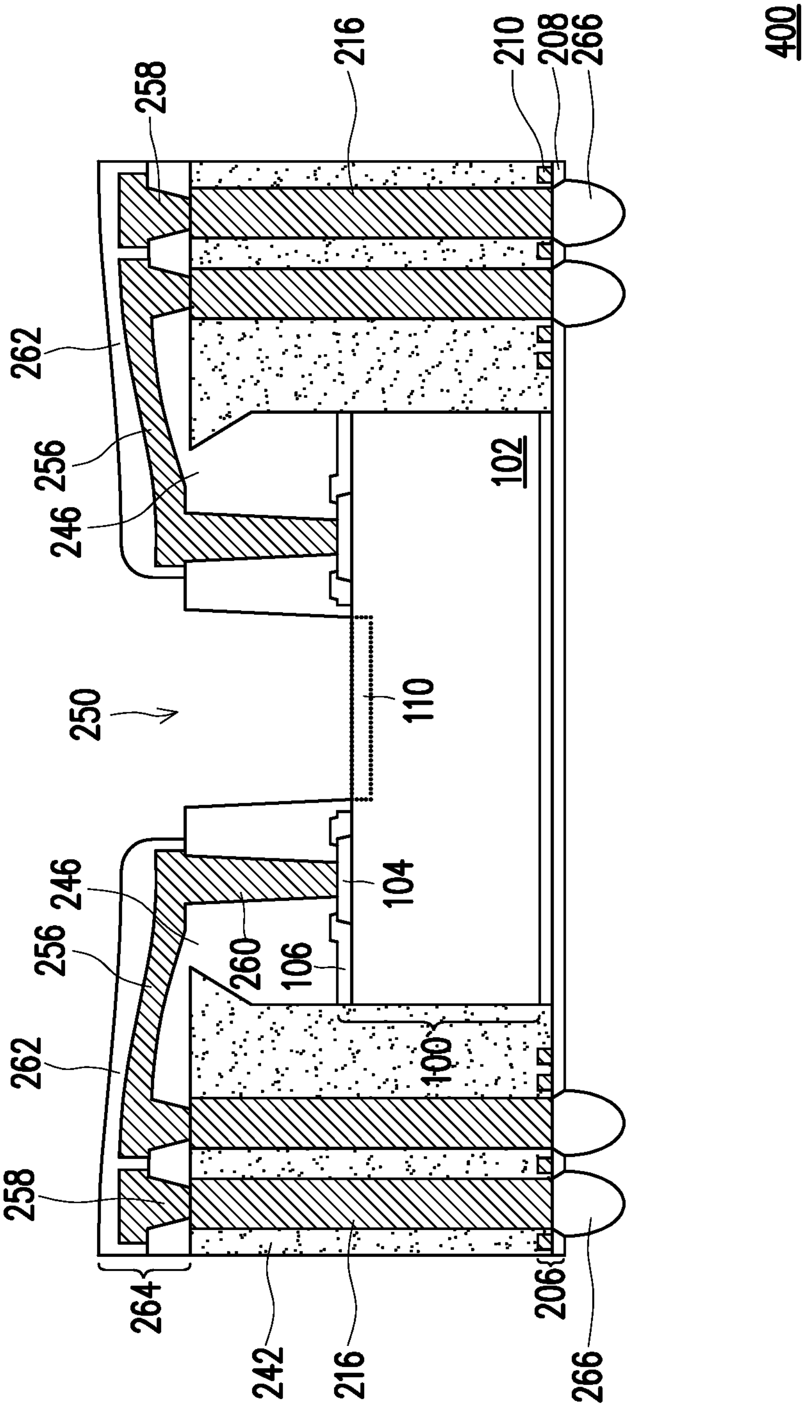
Figure 28:
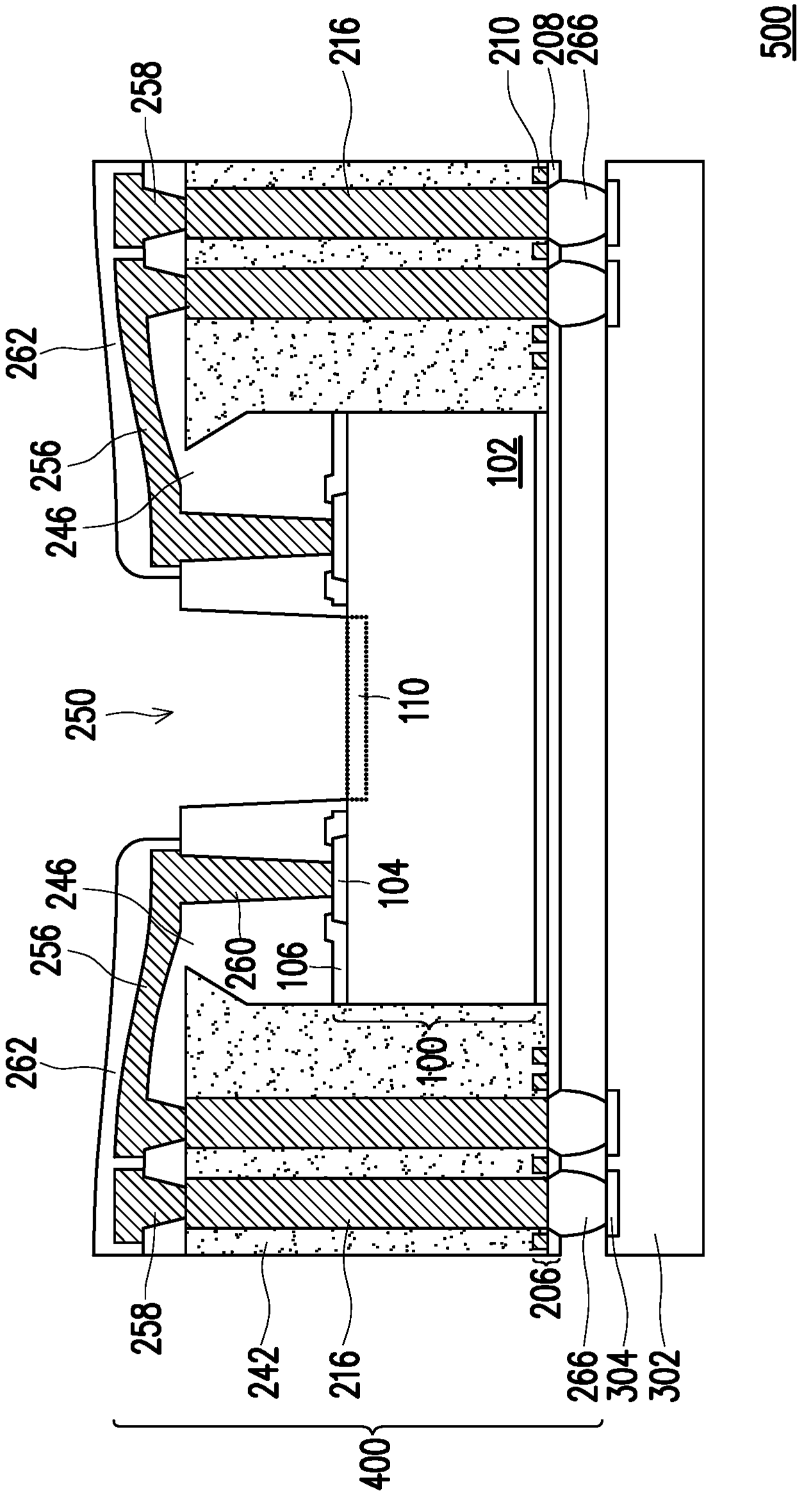
FIG. 28 illustrates a cross-sectional view of an intermediate step during a process for forming a sensor device, in accordance with some embodiments.

In FIG. 27, a carrier substrate de-bonding process is performed to detach (or "de-bond") the carrier substrate 202 from the adhesive 228 and the back-side redistribution structure 206 (e.g., the dielectric layer 208). Openings are then formed through the dielectric layer 208 to expose portions of the metallization pattern 210 and/or conductive vias 216. Conductive connectors 266 are then formed in the openings in the dielectric layer 208 to form the sensor package 400, in accordance with some embodiments. The conductive connectors 266 may be physically and electrically connected the metallization pattern 210 and/or conductive vias 216.

In some embodiments, multiple sensor packages 400 are formed on a single carrier substrate 202, and a singulation process is performed to form individual sensor packages 400. The singulation process may be, for example, sawing, laser drilling, or the like. By forming a sensor package 400 as described herein (e.g., using a sacrificial layer 112 and removing the sacrificial layer 112 using a wet etching process), the thickness of the sensor package 400 may be reduced. Additionally, the sensor region 110 may be formed closer to the top of the sensor package 400 (e.g., the top of the dielectric layer 262), which can improve sensing performance.

In FIG. 28, the sensor package 400 is mounted to a package substrate 302 using the conductive connectors 266 to form a sensor device 500, in accordance with some embodiments. The package substrate 302 may include active and passive devices (not shown). As one of ordinary skill in the art will recognize, a wide variety of devices such as transistors, capacitors, resistors, combinations of these, and the like may be used to generate the structural and functional requirements of the design for the sensor device 500. The devices may be formed using any suitable methods. The package substrate 302 may also include metallization layers and vias (not shown) and bond pads 304 over the metallization layers and vias. In some embodiments, the package substrate 302 is substantially free of active and passive devices.

Embodiments may achieve advantages. By forming a sacrificial layer (e.g., sacrificial layer 112) over a sensor die (e.g., sensor die 100) that is removable using a wet etching process or a dry etching process, a redistribution structure may be formed to electrically connect the sensor die instead of using wire bonds. In this manner, a sensor die may be used as part of an Integrated Fan-Out (InFO) package (e.g., the sensor package 200). Packaging a sensor die in an InFO package may allow the form factor of the final sensor package to be decreased. For example, some InFO sensor packages may be thinner than wire bond sensor packages. This may allow the sensor region (e.g., sensor region 110) of the sensor die to be closer to the outside of the sensor package, which can improve sensitivity or responsivity of the sensing operation. Further, wire loops over the sensor region of the sensor die may be avoided, also reducing the distance between the sensing region and the target or environment to be sensed, thereby increasing sensitivity of the sensor die. The mechanical reliability of the sensor package may also be improved over other (e.g., wire bond) packaging schemes. The manufacturing yield of InFO packages may also be greater than that of wire bond packages. Because an InFO package exposes less surface area of a sensor die than other packaging schemes, sensing regions of the sensor die may be easier to keep clean, improving sensing accuracy. Additionally, by using a removable sacrificial film, the cost of manufacture or total processing time of a sensor package may be reduced.

In an embodiment, a device includes a sensor die having a sensing region at a top surface of the sensor die, an encapsulant at least laterally encapsulating the sensor die, a conductive via extending through the encapsulant, and a front-side redistribution structure on the encapsulant and on the top surface of the sensor die, wherein the front-side redistribution structure is connected to the conductive via and the sensor die, wherein an opening in the front-side redistribution structure exposes the sensing region of the sensor die, and wherein the front-side redistribution structure includes a first dielectric layer extending over the encapsulant and the top surface of the sensor die, a metallization pattern on the first dielectric layer, and a second dielectric layer extending over the metallization pattern and the first dielectric layer. In an embodiment, the device includes a back-side redistribution structure, wherein a bottom surface of the sensor die is attached to the back-side redistribution structure, and wherein the conductive via is connected to the back-side redistribution structure. In an embodiment, a portion of the first dielectric layer extending over the top surface of the sensor die has a thickness greater than the thickness of a portion of the first dielectric layer extending over the encapsulant. In an embodiment, the front-side redistribution structure is connected to the conductive via by a first via extending through the first dielectric layer and is connected to the sensor die by a second via extending through the first dielectric layer. In an embodiment, the conductive via protrudes from the encapsulant. In an embodiment, the second dielectric layer extends over the sensor die, and wherein a vertical distance between the top surface of the sensor die and a top surface of the second dielectric layer is between 5 μm and 50 μm. In an embodiment, the first dielectric layer extending over the top surface of the sensor die has a top surface that is lower than the first dielectric layer extending over the encapsulant. In an embodiment, the opening is defined by a sidewall of the second dielectric layer and a sidewall of the first dielectric layer, wherein the sidewall of the second dielectric layer is laterally recessed from the sidewall of the first dielectric layer.

In an embodiment, a package includes a semiconductor die including a contact pad on a top surface of the semiconductor die and a sensing region on the top surface of the semiconductor die, an encapsulant surrounding the semiconductor die, wherein the top surface of the semiconductor die is free of encapsulant, a conductive via extending through the encapsulant, the conductive via separated from the semiconductor die by the encapsulant, a first dielectric layer extending over a top surface of the encapsulant, along a sidewall of the encapsulant, and over the top surface of the semiconductor die, wherein the first dielectric layer has a first opening that exposes the sensing region of the semiconductor die, a conductive layer over a top surface of the first dielectric layer, the conductive layer extending through the first dielectric layer to contact the conductive via and extending through the first dielectric layer to contact the contact pad, and a second dielectric layer overlying the conductive layer, wherein the second dielectric layer has a second opening that exposes the sensing region of the semiconductor die through the first opening in the first dielectric layer. In an embodiment, the sidewall of the encapsulant extends over the semiconductor die. In an embodiment, the second opening has a larger width than the first opening. In an embodiment, a portion of the first dielectric layer that extends over the semiconductor die has a top surface that is lower than a top surface of the encapsulant. In an embodiment, a thickness of the first dielectric layer on the encapsulant is between 2 μm and 10 μm. In an embodiment, the sidewall of the encapsulant slopes away from the semiconductor die. In an embodiment, the first opening in the first dielectric layer has a width between 5 μm and 50 μm. In an embodiment, a bottom surface of the semiconductor die is attached to a redistribution structure.

In an embodiment, a method includes forming a sacrificial layer on a semiconductor die, the semiconductor die having a sensor, forming a conductive via on a first redistribution structure, placing the semiconductor die on the first redistribution structure adjacent the conductive via, encapsulating the semiconductor die, the sacrificial layer, and the conductive via with an encapsulant, planarizing the encapsulant to expose the conductive via and the sacrificial layer, removing the sacrificial layer using an etching process, and forming a second redistribution structure over the encapsulant and over the semiconductor die, wherein the second redistribution structure is electrically connected to the conductive via and to the semiconductor die, and wherein the second redistribution structure includes an opening that exposes the sensor of the semiconductor die. In an embodiment, the etching process includes a wet chemical etching process. In an embodiment, the etching process includes a dry plasma etching process. In an embodiment, the method includes, after forming the sacrificial layer on the semiconductor die, using a laser process to remove the sacrificial layer over a scribe region and using a sawing process on the scribe region to singulate the semiconductor die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a sacrificial layer on a semiconductor die, the semiconductor die comprising a sensor;

forming a conductive via on a first redistribution structure;

placing the semiconductor die on the first redistribution structure adjacent the conductive via;

encapsulating the semiconductor die, the sacrificial layer, and the conductive via with an encapsulant;

planarizing the encapsulant to expose the conductive via and the sacrificial layer;

removing the sacrificial layer using an etching process, wherein after removing the sacrificial layer, a top surface of the conductive via is above a top surface of the encapsulant; and forming a second redistribution structure over the encapsulant and over the semiconductor die, wherein the second redistribution structure is electrically connected to the conductive via and to the semiconductor die, and wherein the second redistribution structure comprises an opening that exposes the sensor of the semiconductor die.

2. The method of claim 1, wherein the etching process comprises a wet chemical etching process.

3. The method of claim 1, wherein the etching process comprises a dry plasma etching process.

4. The method of claim 1, further comprising, after forming the sacrificial layer on the semiconductor die, using a laser process to remove the sacrificial layer over a scribe region and using a sawing process on the scribe region to singulate the semiconductor die.

5. The method of claim 1, wherein the sacrificial layer comprises a polymer.

6. The method of claim 1, wherein after removing the sacrificial layer, a portion of the encapsulant overhangs the semiconductor die.

7. The method of claim 1, wherein forming the second redistribution structure comprises:

depositing a first dielectric layer over the encapsulant and over the semiconductor die;

patterning the first dielectric layer;

forming a metallization pattern on the patterned first dielectric layer; and depositing a second dielectric layer over the metallization pattern.

8. A method comprising:

forming a conductive via on a substrate;

depositing a polymer material on a sensor device; after depositing the polymer material on the sensor device, attaching the sensor device to the substrate;

depositing a molding material on the conductive via, the sensor device; and the polymer material;

after depositing the molding material, removing the polymer material to expose the sensor device;

depositing a dielectric material on the molding material, the conductive via, and the sensor device;

removing a first portion of the dielectric material to expose a sensing region of the sensor device; and forming a metallization pattern on the dielectric material, wherein the metallization pattern physically and electrically contacts the conductive via and the sensor device.

9. The method of claim 8, wherein the substrate comprises a redistribution layer, wherein the conductive via is electrically connected to the redistribution layer.

10. The method of claim 8, further comprising removing a second portion of the dielectric material to expose a contact pad of the sensor device.

11. The method of claim 8, further comprising performing a planarization process on the molding material to expose the polymer material.

12. The method of claim 8, wherein after forming the metallization pattern, the sensing region of the sensor device is exposed.

13. The method of claim 8, wherein forming the metallization pattern comprises:

depositing a photoresist on the dielectric material and on the exposed sensing region of the sensor device;

patterning the photoresist, wherein the patterned photoresist covers the sensing region of the sensor device; and depositing a conductive material over the patterned photoresist and over the dielectric material.

14. The method of claim 13, further comprising:

depositing an insulating material over the conductive material; and etching the insulating material to expose the sensing region of the sensor device.

15. A method comprising:

forming a semiconductor device comprising a sensor region;

depositing a sacrificial material over the sensor region of the semiconductor device;

attaching the semiconductor device to a redistribution structure;

encapsulating the semiconductor device and the sacrificial material with an encapsulant;

forming a via penetrating the encapsulant to contact the redistribution structure;

removing the encapsulant to expose the sacrificial material;

etching the sacrificial material to expose the sensor region;

depositing a first dielectric material over the via, the encapsulant, and the semiconductor device;

forming openings in the first dielectric material that expose the via and the semiconductor device, wherein before forming the openings, a first top surface of the first dielectric material that extends over the encapsulant slopes downward toward the semiconductor device; and forming a metallization pattern over the first dielectric material, the via, and the semiconductor device, wherein the metallization pattern electrically connects the via to the semiconductor device.

16. The method of claim 15, further comprising etching the first dielectric material to expose the sensor region.

17. The method of claim 15, wherein removing the encapsulant comprises a planarization process.

18. The method of claim 15, wherein the first top surface slopes downward at an angle in a range of 20 degrees to 60 degrees.

19. The method of claim 15, wherein before forming the openings, a second top surface of the first dielectric material that extends over the semiconductor device is closer to the redistribution structure than the first top surface.

20. The method of claim 19, wherein before forming the openings, a third top surface of the first dielectric material that extends over the semiconductor device extends at an angle from the second top surface in a range of 105 degrees to 170 degrees.

* * * * *